(12) United States Patent
Noble et al.

(10) Patent No.: US 6,764,901 B2
(45) Date of Patent: Jul. 20, 2004

(54) CIRCUIT AND METHOD FOR A FOLDED BIT LINE MEMORY CELL WITH VERTICAL TRANSISTOR AND TRENCH CAPACITOR

(75) Inventors: Wendell P. Noble, Milton, VT (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 43 days.

(21) Appl. No.: 09/551,027

(22) Filed: Apr. 17, 2000

(65) Prior Publication Data

US 2002/0006699 A1 Jan. 17, 2002

Related U.S. Application Data

(62) Division of application No. 08/939,742, filed on Oct. 6, 1997, now Pat. No. 6,066,869.

(51) Int. Cl.[7] .......................................... H01L 21/8242
(52) U.S. Cl. ...................... 438/243; 438/241; 438/268; 438/270; 438/587
(58) Field of Search ................................ 438/243, 244, 438/248, 241, 268, 270, 587

(56) References Cited

U.S. PATENT DOCUMENTS

| | | | |
|---|---|---|---|
| 3,806,741 A | 4/1974 | Smith | 307/304 |
| 4,051,354 A | 9/1977 | Choate | 235/312 |
| 4,252,579 A | 2/1981 | Ho et al. | 148/174 |

(List continued on next page.)

FOREIGN PATENT DOCUMENTS

| | | | | |
|---|---|---|---|---|
| EP | 0 198 590 A2 | * | 10/1986 | |
| JP | 63066963 | | 3/1988 | H01L/27/10 |
| JP | 363066963 A | | 3/1988 | 257/305 |
| JP | 11-135757 | | 5/1999 | H01L/27/108 |
| JP | 2000-164883 | | 6/2000 | H01L/29/786 |

OTHER PUBLICATIONS

Adler, E., et al., "The Evolution of IBM CMOS DRAM Technology", 167–188, (Jan./Mar., 1995).

Asai, S., et al., "Technology Challenges for Integration Near and Below 0.1 micrometer", *Proceedings of the IEEE*, 85, Special Issue on Nanometer–Scale Science & Technology, 505–520, (Apr. 1997).

Askin, H.O., et al., "Fet Device Parameters for Compensation Circuit", *IBM Technical Disclosure Bulletin*, 14, 2088–2089, (Dec. 1971).

Banerjee, S.K., et al.,"Characterization of Trench Transistors for 3–D Memories", *1986 Symposium on VLSI Technology, Digest of Technical Papers*, San Diego, CA, 79–80, (May 28–30, 1986).

Blalock, T.N., et al., "A High–Speed Sensing Scheme for 1T Dynamic RAM's Utilizing the Clamped Bit–Line Sense Amplifier", *IEEE Journal of Solid–State Circuits*, 27(4), pp. 618–624, (Apr. 1992).

(List continued on next page.)

*Primary Examiner*—Michael Trinh
(74) *Attorney, Agent, or Firm*—Schwegman, Lundberg, Woessner & Kluth, P.A.

(57) ABSTRACT

A memory cell for a memory array in a folded bit line configuration. The memory cell includes an access transistor formed in a pillar of single crystal semiconductor material. The access transistor has first and second source/drain regions and a body region that are vertically aligned. The access transistor further includes a gate coupled to a wordline disposed adjacent to the body region. The memory cell also includes a passing wordline that is separated from the gate by an insulator for coupling to other memory cells adjacent to the memory cell. The memory cell also includes a trench capacitor. The trench capacitor includes a first plate that is formed integral with the first source/drain region of the access transistor. The trench capacitor also includes a second plate that is disposed adjacent to the first plate and separated from the first plate by a gate oxide.

40 Claims, 16 Drawing Sheets

U.S. PATENT DOCUMENTS

| | | |
|---|---|---|
| 4,570,176 A | 2/1986 | Kolwicz ...................... 357/42 |
| 4,604,162 A | 8/1986 | Sobczak ..................... 156/657 |
| 4,663,831 A | 5/1987 | Birrittella et al. .......... 29/576 E |
| 4,673,962 A | 6/1987 | Chatterjee et al. .......... 357/23.6 |
| 4,740,826 A | 4/1988 | Chatterjee .................... 357/42 |
| 4,761,768 A | 8/1988 | Turner et al. ............... 365/201 |
| 4,766,569 A | 8/1988 | Turner et al. ............... 365/185 |
| 4,920,065 A | 4/1990 | Chin et al. .................... 437/52 |
| 4,920,389 A | 4/1990 | Itoh ........................... 357/23.6 |
| 4,929,988 A | 5/1990 | Yoshikawa ................. 357/23.5 |
| 4,958,318 A | 9/1990 | Harari ....................... 365/149 |
| 4,987,089 A | 1/1991 | Roberts ....................... 437/34 |
| 5,001,526 A | 3/1991 | Gotou ....................... 357/23.6 |
| 5,006,909 A | 4/1991 | Kosa ......................... 357/23.6 |
| 5,017,504 A | 5/1991 | Nishimura et al. ........... 437/40 |
| 5,021,355 A | 6/1991 | Dhong et al. ................. 437/35 |
| 5,028,977 A | 7/1991 | Kenneth et al. ............. 357/43 |
| 5,057,896 A | 10/1991 | Gotou ........................ 357/49 |
| 5,072,269 A | 12/1991 | Hieda ....................... 357/23.6 |
| 5,102,817 A | 4/1992 | Chatterjee et al. ............ 437/47 |
| 5,110,752 A | 5/1992 | Lu ............................... 437/47 |
| 5,128,831 A | 7/1992 | Fox, III et al. |
| 5,140,388 A | 8/1992 | Bartelink .................. 357/23.4 |
| 5,156,987 A | 10/1992 | Sandhu et al. ................ 437/40 |
| 5,177,028 A | 1/1993 | Manning ..................... 437/41 |
| 5,177,576 A | 1/1993 | Kimura et al. ................ 257/71 |
| 5,181,089 A | 1/1993 | Matsuo et al. .............. 257/299 |
| 5,202,278 A | 4/1993 | Mathews et al. ............. 437/47 |
| 5,208,657 A | 5/1993 | Chatterjee et al. .......... 257/302 |
| 5,216,266 A | 6/1993 | Ozaki ........................ 257/302 |
| 5,220,530 A | 6/1993 | Itoh ........................ 365/189.01 |
| 5,223,081 A | 6/1993 | Doan ......................... 156/628 |
| 5,266,514 A | 11/1993 | Tuan et al. ................... 437/52 |
| 5,292,676 A | 3/1994 | Manning ..................... 437/46 |
| 5,316,962 A | 5/1994 | Matsuo et al. ................ 437/52 |
| 5,320,880 A | 6/1994 | Sandhu et al. .............. 427/578 |
| 5,327,380 A | 7/1994 | Kersh, III et al. .......... 365/195 |
| 5,363,325 A | 11/1994 | Sunouchi et al. ........... 365/149 |
| 5,365,477 A | 11/1994 | Cooper, Jr. et al. ......... 165/174 |
| 5,376,575 A | 12/1994 | Kim et al. .................... 437/52 |
| 5,379,255 A | 1/1995 | Shah ......................... 365/185 |
| 5,382,540 A | 1/1995 | Sharma et al. ................ 437/52 |
| 5,385,854 A | 1/1995 | Batra et al. ................... 437/41 |
| 5,391,911 A | 2/1995 | Beyer et al. ................. 257/522 |
| 5,392,245 A | 2/1995 | Manning ..................... 365/200 |
| 5,393,704 A | 2/1995 | Huang et al. ............... 437/203 |
| 5,396,093 A | 3/1995 | Lu .............................. 257/306 |
| 5,409,563 A | 4/1995 | Cathey ....................... 156/643 |
| 5,410,169 A | 4/1995 | Yamamoto et al. ......... 257/301 |
| 5,414,287 A | 5/1995 | Hong ......................... 257/316 |
| 5,422,499 A | 6/1995 | Manning ..................... 257/67 |
| 5,427,972 A | 6/1995 | Shimizu et al. ............... 437/52 |
| 5,429,955 A * | 7/1995 | Joyner et al. ............... 438/480 |
| 5,432,739 A | 7/1995 | Pein ............................ 365/185 |
| 5,438,009 A | 8/1995 | Yang et al. .................... 437/52 |
| 5,440,158 A | 8/1995 | Sung-Mu .................... 257/314 |
| 5,443,992 A | 8/1995 | Risch et al. ................... 437/29 |
| 5,445,986 A | 8/1995 | Hirota ........................ 437/60 |
| 5,451,538 A | 9/1995 | Fitch et al. ................... 487/60 |
| 5,460,316 A | 10/1995 | Hefele ......................... 228/39 |
| 5,460,988 A | 10/1995 | Hong .......................... 437/43 |
| 5,466,625 A | 11/1995 | Hsieh et al. .................. 437/52 |
| 5,483,094 A | 1/1996 | Sharma et al. .............. 257/316 |
| 5,483,487 A | 1/1996 | Sung-Mu ............... 365/185.33 |
| 5,492,853 A | 2/1996 | Jeng et al. ..................... 437/60 |
| 5,495,441 A | 2/1996 | Hong ...................... 365/185.01 |
| 5,497,017 A | 3/1996 | Gonzales ................... 257/306 |
| 5,504,357 A | 4/1996 | Kim et al. ................... 257/306 |
| 5,508,219 A | 4/1996 | Bronner et al. ............... 437/52 |
| 5,508,542 A | 4/1996 | Geiss et al. ................. 257/301 |
| 5,519,236 A | 5/1996 | Ozaki ......................... 257/302 |
| 5,528,062 A | 6/1996 | Hsieh et al. ................. 257/298 |
| 5,528,173 A | 6/1996 | Merritt et al. ................ 326/80 |
| 5,563,083 A | 10/1996 | Pein ............................ 437/43 |
| 5,574,299 A | 11/1996 | Kim ........................... 257/296 |
| 5,593,912 A | 1/1997 | Rajeevakumar .............. 437/52 |
| 5,612,559 A | 3/1997 | Park et al. ................... 257/302 |
| 5,616,934 A | 4/1997 | Dennison et al. ............. 257/67 |
| 5,640,342 A | 6/1997 | Gonzalez .................... 365/156 |
| 5,640,350 A | 6/1997 | Iga ............................. 365/186 |
| 5,641,545 A | 6/1997 | Sandhu ....................... 427/573 |
| 5,644,540 A | 7/1997 | Manning .................... 365/200 |
| 5,646,900 A | 7/1997 | Tsukude et al. ............. 365/205 |
| 5,691,230 A | 11/1997 | Forbes ........................ 437/62 |
| 5,696,011 A | 12/1997 | Yamazaki et al. |
| 5,705,415 A | 1/1998 | Orlowski et al. ............. 437/43 |
| 5,707,885 A | 1/1998 | Lim ............................ 437/52 |
| 5,714,793 A | 2/1998 | Cartagena et al. .......... 257/507 |
| 5,780,888 A | 7/1998 | Maeda et al. ............... 257/302 |
| 5,874,760 A | 2/1999 | Burns, Jr. et al. ........... 257/315 |
| 5,879,971 A | 3/1999 | Witek ......................... 438/238 |
| 5,933,717 A | 8/1999 | Hause et al. ................. 438/200 |
| 5,943,267 A | 8/1999 | Sekariapuram et al. 365/185.28 |
| 5,981,995 A | 11/1999 | Selcuk ........................ 257/330 |
| 5,998,820 A | 12/1999 | Chi et al. .................... 257/296 |
| 6,016,268 A | 1/2000 | Worley ....................... 365/149 |
| 6,040,210 A | 3/2000 | Burns, Jr. et al. ........... 438/238 |
| 6,040,218 A | 3/2000 | Lam ........................... 438/259 |
| 6,072,209 A | 6/2000 | Noble et al. ................. 257/296 |
| 6,143,636 A | 11/2000 | Forbes et al. ............... 438/587 |
| 6,150,687 A | 11/2000 | Noble et al. ................ 257/302 |
| 6,156,604 A * | 12/2000 | Forbes et al. ............... 438/241 |
| 6,156,607 A * | 12/2000 | Noble et al. ................ 438/244 |
| 6,165,836 A | 12/2000 | Forbes et al. .............. 438/243 |
| 6,172,391 B1 | 1/2001 | Goebel ....................... 257/305 |
| 6,172,535 B1 | 1/2001 | Hopkins ...................... 327/66 |
| 6,181,121 B1 | 1/2001 | Kirkland et al. ............ 323/313 |
| 6,181,196 B1 | 1/2001 | Nguyen ...................... 327/539 |
| 6,208,164 B1 | 3/2001 | Noble et al. ................. 326/41 |
| 6,238,976 B1 | 5/2001 | Noble et al. ................ 438/259 |
| 6,242,775 B1 | 6/2001 | Noble ........................ 257/330 |
| 6,323,719 B1 | 11/2001 | Chang et al. ............... 327/478 |
| 6,433,382 B1 | 8/2002 | Orlowski et al. ........... 257/315 |
| 6,498,065 B1 | 12/2002 | Forbes et al. ............... 438/259 |
| 6,528,837 B2 | 3/2003 | Forbes et al. ............... 257/302 |

OTHER PUBLICATIONS

Bomchil, G., et al., "Porous Silicon: The Material and its Applications in Silicon–On–Insulator Technologies", *Applied Surface Science*, 41/42, 604–613, (1989).

Burnett, D., et al., "Implications of Fundamental Threshold Voltage Variations for High–Density SRAM and Logic Circuits", *1994 Symposium on VLSI Technology, Digest of Technical Papers*, Honolulu, HI, 15–16, (Jun. 4–7, 1994).

Burnett, D., et al., "Statistical Threshold–Voltage Variation and its Impact on Supply–Voltage Scaling", *Proceedings SPIE: Microelectronic Device and Multilevel Interconnection Technology*, 2636, 83–90, (1995).

Chen, M.J., et al., "Back–Gate Forward Bias Method for Low–Voltage CMOS Digital Cicuits", *IEEE Transactions on Electron Devices*, 43, 904–909, (Jun. 1986).

Chen, M.J., et al., "Optimizing the Match in Weakly Inverted MOSFET's by Gated Lateral Bipolar Action", *IEEE Transactions on Electron Devices*, 43, 766–773, (May 1996).

Chung, I.Y., et al., "A New SOI Inverter for Low Power Applications", *Proceedings of the 1996 IEEE International SOI Conference*, Sanibel Island, FL, 20–21, (Sep. 30–Oct. 3, 1996).

Clemen, R., et al., "VT–compensated TTL–Compatible Mos Amplifier", *IBM Technical Disclosure Bulletin*, 21, 2874–2875, (1978).

De, V.K., et al., "Random MOSFET Parameter Fluctuation Limits to Gigascale Integration (GSI)", *1996 Symposium on VLSI Technology, Digest of Technical Papers*, Honolulu, HI, 198–199, (Jun. 11–13, 1996).

DeBar, D.E., "Dynamic Substrate Bias to Achieve Radiation Hardening", *IBM Technical Disclosure Bulletin*, 25, 5829–5830, (1983).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17(11), 509–511, (Nov. 1996).

Fong, Y., et al., "Oxides Grown on Textured Single–Crystal Silicon—Dependence on Process and Application in EEPROMs", *IEEE Transactions on Electron Devices*, 37(3), pp. 583–590, (Mar. 1990).

Forbes, L., "Automatic On–clip Threshold Voltage Compensation", *IBM Technical Disclosure Bulletin*, 14, 2894–2895, (1972).

Forbes, L., et al., "Resonant Forward–Biased Guard–Ring Diodes for Suppression of Substrate Noise in Mixed–Mode CMOS Circuits", *Electronics Letters*, 31, 720–721, (Apr. 1995).

Foster, R., et a., "High Rate Low–Temperature Selective Tungsten", In: *Tungsten and Other Refractory Metals for VLSI Applications III*, V.A. Wells, eds., Materials Res. Soc., Pittsburgh, PA, 69–72, (1988).

Frantz, H., et al., "Mosfet Substrate Bias–Voltage Generator", *IBM Technical Disclosure Bulletin*, 11, 1219–1220, (Mar. 1969).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Gong, S., et al., "Techniques for Reducing Switching Noise in High Speed Digital Systems", *Proceedings of the 8th Annual IEEE International ASIC Conference and Exhibit*, Austin, TX, 21–24, (1995).

Hao, M.Y., et al., "Electrical Characteristics of Oxynitrides Grown on Textured Single–Crystal Silicon", *Appl. Phys. Lett.*, 60, 445–447, (Jan. 1992).

Harada, M., et al., "Suppression of Threshold Voltage Variation in MTCMOS/SIMOX Circuit Operating Below 0.5 V", *1996 Symposium on VLSI Technology, Digest of Technical Papers*, Honolulu, HI, 96–97, (Jun. 11–13, 1996).

Heavens, O., *Optical Properties of Thin Solid Films*, Dover Pubs. Inc. New York, 167, (1965).

Hisamoto, D., et al., "A New Stacked Cell Structure for Giga–Bit DRAMs using Vertical Ultra–Thin SOI (DELTA) MOSFETs", *1991 IEEE International Electron Devices Meeting, Technical Digest*, Washington, D.C., 959–961, (Dec. 8–11, 1991).

Hodges, D.A., et al., "MOS Decoders", In: *Analysis and Design of Digital Integrated Circuits*, 2nd Edition, Section 9.1.3, 354–357, (1988).

Holman, W.T., et al., "A Compact Low Noise Operational Amplifier for a 1.2 Micrometer Digital CMOS Technology", *IEEE Journal of Solid–State Circuits*, 30, 710–714, (Jun. 1995).

Horie, H., et al., "Novel High Aspect Ratio Aluminum Plug for Logic/DRAM LSI's Using Polysilicon–Aluminum Substitute", *Technical Digest: IEEE International Electron Devices Meeting*, San Francisco, CA, 946–948, (1996).

Hu, G., et al., "Will Flash Memory Replace Hard Disk Drive?", *1994 IEEE International Electron Device Meeting*, Panel Discussion, Session 24, Outline, 1 p., (Dec. 13, 1994).

Huang, W.L., et al., "TFSOI Complementary BiCMOS Technology for Low Power Applications", *IEEE Transactions on Electron Devices*, 42, 506–512, (Mar. 1995).

Jun, Y.K., et al., "The Fabrication and Electrical Properties of Modulated Stacked Capacitor for Advanced DRAM Applications", *IEEE Electron Device Letters*, 13, 430–432, (Aug. 1992).

Jung, T.S., et al., "A 117–mm2 3.3–V Only 128–Mb Multilevel NAND Flash Memory for Mass Storage Applications", *IEEE Journal of Solid–State Circuits*, 31, 1575–1582, (Nov. 1996).

Kang, H.K., et al., "Highly Manufacturable Process Technology for Reliable 256 Mbit and 1Gbit DRAMs", *IEEE International Electron Devices Meeting, Technical Digest*, San Francisco, CA, 635–638, (Dec. 11–14, 1994).

Kim, Y.S., et al., "A Study on Pyrolysis DMEAA for Selective Deposition of Aluminum", In: *Advanced Metallization and Interconnect Systems for ULSI Applications in 1995*, R.C. Ellwanger, et al., (eds.), Materials Research Society, Pittsburgh, PA, 675–680, (1996).

Kishimoto, T., et al., "Well Structure by High–Energy Boron Implantation for Soft–Error Reduction in Dynamic Random Access Memories (DRAMs)", *Japanese Journal of Applied Physics*, 14, 6899–6902, (Dec. 1995).

Klaus, et al., "Atomic Layer Controlled Growth of SiO2 Films Using Binary Reaction Sequence Chemistry", *Applied Physics Lett.* 70(9), 1092–94, (Mar. 3, 1997).

Kohyama, Y., et al., "Buried Bit–Line Cell for 64MB DRAMs", *1990 Symposium on VLSI Technology, Digest of Technical Papers*, Honoluly, HI, 17–18, Jun. 4–7, 1990).

Koshida, N., et al., "Efficient Visible Photoluminesceence from Porous Silicon", *Japanese Journal of Applied Physics*, 30, L1221–L1223, (Jul. 1991).

Kuge, S., et al., "SOI–DRAM Circuit Technologies for Low Power High Speed Multigiga Scale Memories", *IEEE Journal of Solid–State Circuits*, 31(4), pp. 586–591, (Apr. 1996).

Lantz, II, L., "Soft Errors Induced By Alpha Particles", *IEEE Transactions on Reliability*, 45, 174–179, (Jun. 1996).

Lehmann, et al., "A Novel Capacitor Technology Based on Porous Silicon", *Thin Solid Films* 276, Elsevier Science, 138–42, (1996).

Lehmann, V., "The Physics of Macropore Formation in Low Doped n–Type Silicon", *Journal of the Electrochemical Society*, 140(10), 2836–2843, (Oct. 1993).

Lu, N., et al., "The SPT Cell—A New Substrate–Plate Trench Cell for DRAMs", *1995 IEEE International Electron Devices Meeting, Technical Digest*, Washington, D.C., 771–772, (Dec. 1–4, 1985).

MacSweeney, D., et al., "Modelling of Lateral Bipolar Devices in a CMOS Process", *IEEE Bipolar Circuits and Technology Meeting*, Minneapolis, MN, 27–30, (Sep. 1996).

Maeda, S., et al., "A Vertical Phi–Shape Transistor (VPhiT) Cell for 1 Gbit DRAM and Beyond", *1994 Symposium of VLSI Technology, Digest of Technical Papers*, Honolulu, HI, 133–134, (Jun. 7–9, 1994).

Maeda, S., et al., "Impact of a Vertical Phi–Shape Transistor (VPhiT) Cell for 1 Gbit DRAM and Beyond", *IEEE Transactions on Electron Devices,* 42, 2117–2123, (Dec. 1995).

Malaviya, S., *IBM TBD,* 15, p. 42, (Jul. 1972).

Masu, K., et al., "Multilevel Metallizatin Based on Al CVD", *1996 IEEE Symposium on VLSI Technology, Digest of Technical Papers,* Honolulu, HI, 44–45, (Jun. 11–13, 1996).

McCredie, B.D., et al., "Modeling, Measurement, and Simulation of Simultaneous Switching Noise", *IEEE Transactions on Components, Packaging, and Manufacturing Technology—Part B,* 19, 462–472, (Aug. 1996).

Muller, K., et al., "Trench Storage Node Technology for Gigabit DRAM Generations", *Digest IEEE International Electron Devices Meeting,* San Francisco, CA, 507–510, (Dec. 1996).

Nitayama, A., et al., "High Speed and Compact CMOS Circuits with Multipillar Surrounding Gate Transistors", *IEEE Transactions on Electron Devices,* 36, 2605–2606, (Nov. 1989).

Ohba, T., et al., "Evaluation on Selective Deposition of CVD W Films by Measurement of Surface Temperature", In: *Tungsten and Other Refractory Metals for VLSI Applications II,* Materials Research Society, Pittsburgh, PA, 59–66, (1987).

Ohba, T., et al., "Selective Chemical Vapor Deposition of Tungsten Using Silane and Polysilane Reductions", In: *Tungsten and Other Refractory Metals for VLSI Applications IV,* Materials Research Society, Pittsburgh, PA, 17–25, (1989).

Ohno, Y., et al., "Estimation of the Charge Collection for the Soft–Error Immunity by the 3D–Device Simulation and the Quantitative Investigation", *Simulation of Semiconductor Devices and Processes,* 6, 302–305, (Sep. 1995).

Oowaki, Y., et al., "New alpha–Particle Induced Soft Error Mechanism in a Three Dimensional Capacitor Cell", *IEICE Transactions on Electronics,* 78–C, 845–851, (Jul. 1995).

Oshida, S., et al., "Minority Carrier Collection in 256 M–bit DRAM Cell on Incidence of Alpha–Particle Analyzed by Three–Dimensional Device Simulation", *IEICE Transactions on Electronics,* 76–C, 1604–1610, (Nov. 1993).

Ott, A.W., et al., "A1303 Thin Film Growth on Si(100) Using Binary Reaction Sequence Chemistry", *Thin Solid Films,* vol. 292, 135–44, (1997).

Ozaki, T., et al., "A Surrounding Isolation–Merged Plate Electrode (SIMPLE) Cell with Checkered Layout for 256Mbit DRAMs and Beyond", *1991 IEEE International Electron Devices Meeting,* Washington, D.C., 469–472, (Dec. 8–11, 1991).

Parke, S.A., et al., "A High–Performance Lateral Bipolar Transistor Fabricated on SIMOX", *IEEE Electron Device Letters,* 14, 33–35, (Jan. 1993).

Pein, H., et al., "A 3–D Sidewall Flash EPROM Cell and Memory Array", *IEEE Transactions on Electron Devices,* 40, 2126–2127, (Nov. 1993).

Pein, H., et al., "Performance of the 3–D PENCIL Flash EPROM Cell and Memory Array", *IEEE Transactions on Electron Devices,* 42, 1982–1991, (Nov. 1995).

Pein, H.B., et al., "Performance of the 3–D Sidewall Flash EPROM Cell", *IEEE International Electron Devices Meeting, Technical Digest,* 11–14, (1993).

Puri, Y., "Substrate Voltage Bounce in NMOS Self–biased Substrates", *IEEE Journal of Solid–State Circuits,* SC–13, 515–519, (Aug. 1978).

Ramo, S., et al., *Fields and Waves in Communication Electronics, Third Edition,* John Wiley & Sons, Inc., pp. 428–433, (1994).

Rao, K.V. et al., "Trench Capacitor Design Issues in VLSI DRAM Cells", *1986 IEEE International Electron Devices Meeting, Technical Digest,* Los Angeles, CA, 140–143, (Dec. 7–10, 1986).

Richardson, W.F., et al., "A Trench Transistor Cross–Point DRAM Cell", *IEEE International Electron Devices Meeting,* Washington, D.C., 714–717, (Dec. 1–4, 1985).

Sagara, K., et al., "A 0.72 micro–meter2 Recessed STC (RSTC) Technology for 256Mbit DRAMs using Quarter–Micron Phase–Shift Lithography", *1992 Symposium on VLSI Technology, Digest of Technical Papers,* Seattle, WA, 10–11, (Jun. 2–4, 1992).

Saito, M., et al., "Technique for Controlling Effective Vth in Multi–Gbit DRAM Sense Amplifier", *1996 Symposium on VLSI Circuits, Digest of Technical Papers,* Honoluly, HI, 106–107, (Jun. 13–15, 1996).

Seevinck, E., et al., "Current–Mode Techniques for High–Speed VLSI Circuits with Application to Current Sense Amplifier for CMOS SRAM's", *IEEE Journal of Solid State Circuits,* 26(4), pp. 525–536, (Apr. 1991).

Senthinathan, R., et al., "Reference Plane Parasite Modeling and Their Contribution to the Power and Ground Path "Effective" Inductance as Seen by the Output Drivers", *IEEE Transactions on Microwave Theory and Techniques,* 42, 1765–1773, (Sep. 1994).

Shah, A.H., et al., "A 4–Mbit DRAM with Trench–Transistor Cell", *IEEE Journal of Solid–State Circuits,* SC–21, 618–625, (Oct. 1986).

Shah, A.H., et al., "A 4Mb DRAM with Cross–Point Trench Transistor Cell", *1986 IEEE International Solid–State Circuits Conference, Digest of Technical Papers,* 268–269, (Feb. 21, 1986).

Sherony, M.J., et al., "Reduction of Threshold Voltage Sensitivity in SOI MOSFET's", *IEEE Electron Device Letters,* 16, 100–102, (Mar. 1995).

Shimomura, K., et al., "A 1V 46ns 16Mb SOI–DRAM with Body Control Technique", *1997 IEEE International Solid–State Circuits Conference, Digest of Technical Papers,* 68–69, (Feb. 6, 1997).

Stanisic, B.R., et al., "Addressing Noise Decoupling in Mixed–Signal IC's: Power Distribution Design and Cell Customization", *IEEE Journal of Solid–State Circuits,* 30, 321–326, (Mar. 1995).

Stellwag, T.B., et al., "A Vertically–Integrated GaAs Bipolar DRAM Cell", *IEEE Transactions on Electron Devices,* 38, 2704–2705, (Dec. 1991).

Su, D.K., et al., "Experimental Results and Modeling Techniques for Substrate Noise in Mixed–Signal Integrated Circuits", *IEEE Journal of Solid–State Circuits,* 28(4), 420–430, (Apr. 1993).

Suma, K., et al., "An SOI–DRAM with Wide Operating Voltage Range by CMOS/SIMOX Technology", *IEEE Journal of Solid–State Circuits,* 29(11), pp. 1323–1329, (Nov. 1994).

Sunouchi, K., et al., "A Surrounding Gate Transistor (SGT) Cell for 64/256Mbit DRAMs", *1989 IEEE International Electron Devices Meeting, Technical Digest,* Washington, D.C., 23–26, (Dec. 3–6, 1989).

Sunouchi, K., et al., "Process Integration for 64M DRAM Using an Asymmetrical Stacked Trench Capacitor (AST) Cell", *1990 IEEE International Electron Devices Meeting*, San Francisco, CA, 647–650, (Dec. 9–12, 1990).

Suntola, T., "Atomic Layer Epitaxy", *Handbook of Crystal Growth 3, Thin Films of Epitaxy, Part B: Growth Mechanics and Dynamics*, Elsevier, Amsterdam, 601–63, (1994).

Sze, S.M., *VLSI Technology*, 2nd Edition, Mc Graw–Hill, NY, 90, (1988).

Takai, M., et al., "Direct Measurement and Improvement of Local Soft Error Susceptibility in Dynamic Random Access Memories", *Nuclear Instruments & Methods in Physics Research*, B–99, Proceedings of the 13th International Conference on the Application of Accelerators in Research and Industry, Denton, TX, 562–565, (Nov. 7–10, 1994).

Takato, H., et al., "High Performance CMOS Surrounding Gate Transistor (SGT) for Ultra High Density LSIs", *IEEE International Electron Devices Meeting, Technical Digest*, 222–225, (1988).

Takato, H., et al., "Impact of Surrounding Gate Transistor (SGT) for Ultra–High Density LSI's", *IEEE Transactions on Electron Devices*, 38, 573–578, (Mar. 1991).

Tanabe, N., et al., "A Ferroelectric Capacitor Over Bit–Line (F–COB) Cell for High Density Nonvolatile Ferroelectric Memories", *1995 Symposium on VLSI Technology, Digest of Technical Papers*, Kyoto, Japan, 123–124, (Jun. 6–8, 1995).

Temmler, D., "Multilayer Vertical Stacked Capacitors (MVSTC) for 64Mbit and 256Mbit DRAMs", *1991 Symposium on VLSI Technology, Digest of Technical Papers*, Oiso, 13–14, (May 28–30, 1991).

Terauchi, M., et al., "A Surrounding Gate Transistor (SGT) Gain Cell for Ultra High Density DRAMs", *1991 Symposium on VLSI Technology, Digest of Technical Papers*, Kyoto, Japan, 21–22, (1993).

Tsui, P.G., et al., "A Versatile Half–Micron Complementary BiCMOS Technology for Microprocessor–Based Smart Power Applications", *IEEE Transactions on Electron Devices*, 42, 564–570, (Mar. 1995).

Verdonct–Vandebroek, S., et al., "High–Gain Lateral Bipolar Action in a MOSFET Structure", *IEEE Transactions on Electron Devices* 38, 2487–2496, (Nov. 1991).

Vittal, A., et al., "Clock Skew Optimization for Ground Bounce Control", *1996 IEEE/ACM International Conference on Computer–Aided Design, Digest of Technical Papers*, San Jose, CA, 395–399, (Nov. 10–14, 1996).

Wang, N., *Digital MOS Integrated Circuits*, Prentice–Hall, Inc. , Englewood Cliffe, NJ, p. 328–333, (1989).

Wang, P.W., et al., "Excellent Emission Characterization of Tunneling Oxides Formed Using Ultrathin Silicon Films for Flash Memory Devices", *Japanese Journal of Applied Physics*, 35, 3369–3373, (Jun. 1996).

Watanabe, H., et al., "A New Cylindrical Capacitor Using Hemispherical Grained SI (HSG–Si) for 256Mb DRAMs", *IEEE International Electron Devices Meeting, Technical Digest*, San Francisco, CA, 259–262, (Dec. 13–16, 1992).

Watanabe, H., et al., "A Novel Stacked Capacitor with Porous–Si Electrodes for High Density DRAMs", *1993 Symposium on VLSI Technology, Digest of Technical Papers*, Kyoto, Japan, 17–18, (1993).

Watanabe, H., et al., "An Advanced Fabrication Technology of Hemispherical Grained (HSG) Poly–Si for High Capacitance Storage Electrodes", *Extended Abstracts of the 1991 International Conference on Solid State Devices and Materials*, Yokohama, Japan, 478–480, (1991).

Watanabe, H., et al., "Device Application and Structure Observation for Hemispherical–Grained Si", *J. Appl. Phys.*, 71, 3538–3543, (Apr. 1992).

Watanabe, H., et al., "Hemispherical Grained Silicon (HSG–Si) Formation on In–Situ Phosphorous Doped Amorphous–Si Using the Seeding Method", *Extended Abstracts of the 1992 International Conference on Solid State Devices and Materials*, Tsukuba, Japan, 422–424, (1992).

Watanabe, S., et al., "A Novel Circuit Technology with Surrounding Gate Transistors (SGT's) for Ultra High Density DRAM's", *IEEE Journal of Solid–State Circuits*, 30, 960–971, (Sep. 1995).

Wooley, et al., "Experimental Results and Modeling Techniques for Substrate Noise in Mixed Signal Integrated Circuits", *IEEE Journal of Solid State Circuits*, vol. SC–28, 420–30, (1993).

Yamada, T., et al., "A New Cell Structure with a Spread Source/Drain (SSD) MOSFET and a Cylindrical Capacitor for 64–Mb DRAM's", *IEEE Transactions on Electron Devices*, 38, 2481–2486, (Nov. 1991).

Yamada, T., et al., "Spread Source/Drain (SSD) MOSFET Using Selective Silicon Growth for 64Mbit DRAMs", *1989 IEEE International Electron Devices Meeting, Technical Digest*, Washington, D.C., 35–38, (Dec. 3–6, 1989).

Yoshikawa, K., "Impact of Cell Threshold Voltage Distribution in the Array of Flash Memories on Scaled and Multilevel Flash Cell Design", *1996 Symposium on VLSI Technology, Digest of Technical Papers*, Honolulu, HI, 240–241, (Jun. 11–13, 1996).

Chen, M., et al., "Back–Gate Forward Bias Method for Low Voltage CMOS Digital Cicuits", *IEEE Transactions on Electron Devices*, 43, 904–909, (1996).

De, V.K., et al., "Random Mosfet Parameter Fluctuation Limits to Gigascale Integration (GST)", *Symposium on VLSI Technology Digest of Technical Papers*, 198–199, (1996).

Rhyne, In: *Fundamentals of Digital Systems Design*, Prentice Hall, New Jersey, (1973),p. 70–71.

Su, D., et al. , "Experimental Results and Modeling Techniques for Substrate Noise in Mixed Signal–Integrated Circuits", *IEEE Journal of Solid State Circuits*, 28(4), (1993), pp. 420–430.

Wolf, Stanley , "Isolation Technolgies for Integrated Circuits", *Silicon Processing for the NLSI Era vol. 2 Process Integration*, (1990),66–78.

* cited by examiner

CIRCUIT AND METHOD FOR A FOLDED BIT LINE MEMORY CELL WITH VERTICAL TRANSISTOR AND TRENCH CAPACITOR

This application is a Divisional of U.S. application Ser. No. 08/939,742, filed Oct. 6, 1997, now U.S. Pat. No. 6,066,869.

TECHNICAL FIELD OF THE INVENTION

The present invention relates generally to the field of memory devices and, in particular, to a circuit and method for a folded bit line memory cell with a vertical transistor and a trench capacitor.

BACKGROUND OF THE INVENTION

Electronic systems typically store data during operation in a memory device. In recent years, the dynamic random access memory (DRAM) has become a popular data storage device for such systems. Basically, a DRAM is an integrated circuit that stores data in binary form (e.g., "1" or "0") in a large number of cells. The data is stored in a cell as a charge on a capacitor located within the cell. Typically, a high logic level is approximately equal to the power supply voltage and a low logic level is approximately equal to ground.

The cells of a conventional DRAM are arranged in an array so that individual cells can be addressed and accessed. The array can be thought of as rows and columns of cells. Each row includes a word line that interconnects cells on the row with a common control signal. Similarly, each column includes a bit line that is coupled to at most one cell in each row. Thus, the word and bit lines can be controlled so as to individually access each cell of the array.

A memory array is typically implemented as an integrated circuit on a semiconductor substrate in one of a number of conventional layouts. One such layout is referred to as an "folded digit line" architecture. In this architecture, sense amplifier circuits are provided at the edge of the array. The bit lines are paired in complementary pairs. Each complementary pair in the array feeds into a sense amplifier circuit. The sense amplifier circuit detects and amplifies differences in voltage on the complementary pair of bit lines as described in more detail below.

To read data out of a cell, the capacitor of a cell is accessed by selecting the word line associated with the cell. A complementary bit line that is paired with the bit line for the selected cell is equilibrated with the voltage on the bit line for the selected cell. The equilibration voltage is typically midway between the high and low logic levels. Thus, conventionally, the bit lines are equilibrated to one-half of the power supply voltage, $V_{CC}/2$. When the word line is activated for the selected cell, the capacitor of the selected cell discharges the stored voltage onto the bit line, thus changing the voltage on the bit line.

The sense amplifier detects and amplifies the difference in voltage on the pair of bit lines. The sense amplifier typically includes two main components: an n-sense amplifier and a p-sense amplifier. The n-sense amplifier includes a cross-coupled pair of n-channel transistors that drive the low bit line to ground. The p-sense amplifier includes a cross-coupled pair of p-channel transistors and is used to drive the high bit line to the power supply voltage.

An input/output device for the array, typically an n-channel transistor, passes the voltage on the bit line for the selected cell to an input/output line for communication to, for example, a processor of a computer or other electronic system associated with the DRAM. In a write operation, data is passed from the input/output lines to the bit lines by the input/output device of the array for storage on the capacitor in the selected cell.

Each of the components of a memory device are conventionally formed as part of an integrated circuit on a "chip" or wafer of semiconductor material. One of the limiting factors in increasing the capacity of a memory device is the amount of surface area of chip used to form each memory cell. In the industry terminology, the surface area required for a memory cell is characterized in terms of the minimum feature size, "F," that is obtainable by the lithography technology used to form the memory cell. Conventionally, the memory cell is laid out with a transistor that includes first and second source/drain regions separated by a body or gate region that are disposed horizontally along a surface of the chip. When isolation between adjacent transistors is considered, the surface area required for such a transistor is generally $8F^2$ or $6F^2$.

Some researchers have proposed using a vertical transistor in the memory cell in order to reduce the surface area of the chip required for the cell. Each of these proposed memory cells, although smaller in size from conventional cells, fails to provide adequate operational characteristics when compared to more conventional structures. For example, U.S. Pat. No. 4,673,962 (the '962 Patent) issued to Texas Instruments on Jun. 16, 1997. The '962 Patent discloses the use of a thin poly-silicon field effect transistor (FET) in a memory cell. The poly-silicon FET is formed along a sidewall of a trench which runs vertically into a substrate. At a minimum, the poly-silicon FET includes a junction between poly-silicon channel 58 and the bit line 20 as shown in FIG. 3 of the '962 Patent. Unfortunately, this junction is prone to charge leakage and thus the poly-silicon FET may have inadequate operational qualities to control the charge on the storage capacitor. Other known disadvantages of such thin film poly-silicon devices may also hamper the operation of the proposed cell.

Other researchers have proposed use of a "surrounding gate transistor" in which a gate or word line completely surrounds a vertical transistor. See, e.g., *Impact of a Vertical Φ-shape transistor (VΦT) Cell for 1 Gbit DRAM and Beyond*, IEEE Trans. On Elec. Devices, Vol 42, No.12, December, 1995, pp. 2117–2123. Unfortunately, these devices suffer from problems with access speed due to high gate capacitance caused by the increased surface area of the gate which slows down the rise time of the word lines. Other vertical transistor cells include a contact between the pass transistor and a poly-silicon plate in the trench Such vertical transistor cells are difficult to implement due to the contact and should produce a low yield.

For the reasons stated above, and for other reasons stated below which will become apparent to those skilled in the art upon reading and understanding the present specification, there is a need in the art for realizable memory cell that uses less surface area than conventional memory cells.

SUMMARY OF THE INVENTION

The above mentioned problems with memory cells and other problems are addressed by the present invention and which will be understood by reading and studying the following specification. A memory cell is described which includes a vertical transistor and trench capacitor.

In particular, an illustrative embodiment of the present invention includes a memory cell for a memory array with a folded bit line configuration. The memory cell includes an access transistor that is formed in a pillar of single crystal semiconductor material. The access transistor has first and second sources/drain regions and a body region that are vertically aligned. The access transistor also includes a gate that is coupled to a wordline disposed adjacent to the body region of the access transistor. A passing wordline is separated from the gate by an insulator for coupling to other memory cells adjacent to the memory cell. A trench capacitor is also included. The trench capacitor includes a first plate that is formed integral with the first source/drain region of the access transistor and a second plate that is disposed adjacent to the first plate and separated from the first plate by a gate oxide. In another embodiment, the second plate of the trench capacitor surrounds the second source/drain region. In another embodiment, an ohmic contact is included to couple the second plate to a layer of semiconductor material.

In another embodiment, a memory device is provided. The memory device includes an array of memory cells. Each memory cell includes a vertical access transistor that is formed of a single crystalline semiconductor pillar that extends outwardly from a substrate. The semiconductor pillar includes a body and first and second source/drain regions. A gate is disposed adjacent to a side of the pillar adjacent to the body region. The memory cell also includes a trench capacitor wherein a first plate of the trench capacitor is integral with the first source/drain region and a second plate of the trench capacitor is disposed adjacent to the first plate. The memory device also includes a number of bit lines that are each selectively coupled to a number of the memory cells at the second source/drain region of the access transistor. This forms columns of memory cells in a folded bit line configuration. Finally, the memory device also includes a number of wordlines. The wordlines are disposed substantially orthogonal to the bit lines in trenches between rows of the memory cells. Each trench includes two wordlines. Each wordline is coupled to gates of alternate access transistors on opposite sides of the trench. In another embodiment, the pillars extend outward from a semiconductor portion of the substrate. In another embodiment, a surface area of the memory cell is four $F^2$, wherein F is a minimum feature size. In another embodiment, a second plate of the trench capacitor surrounds the second source/drain region of the access transistor. In another embodiment, the second plate of the trench capacitor is maintained at approximately ground potential. In another embodiment, the pillar has a submicron width so as to allow substantially full depletion of the body region.

In another embodiment, a memory array is provided. The memory array includes a number of memory cells forming an array with a number of rows and columns. Each memory cell includes an access transistor with body and first and second source/drain regions formed vertically, outwardly from a substrate. A gate is disposed adjacent to a side of the transistor. The memory array includes a number of first isolation trenches that separate adjacent rows of memory cells. First and second wordlines are disposed in each of the first isolation trenches. The first and second wordlines are coupled to alternate gates on opposite sides of the trench. The memory array also includes a number of second isolation trenches, each substantially orthogonal to the first isolation trenches and intraposed between the adjacent memory cell.

In another embodiment, a method of fabricating a memory array is provided. A number of access transistors were formed wherein each access transistor is formed in a pillar of semiconductor material that extends outwardly from a substrate. The access transistor includes a first source/drain region, a body region and second source/drain region that are formed vertically. The method also includes forming a trench capacitor wherein a first plate of the trench capacitor is integral with the first source/drain region of the access transistor. Further, the method includes forming a number of wordlines in a number of trenches that separates adjacent rows of access transistors. Each trench includes two wordlines with the gate of each wordline interconnecting alternate access transistors on opposite sides of the trench. Finally, the method includes a number of bit lines that interconnect second source/drain regions of selected access transistors.

In another embodiment, a method of fabricating a memory is provided. The method begins with forming a first conductivity type first source/drain region layer on a substrate. A second conductivity type body region layer is formed on the first source/drain region layer. A first conductivity type second source/drain region layer is formed on the body region layer. Additionally, a plurality of substantially parallel column isolation trenches are formed extending through the second source/drain region layer, the body region layer and the first source/drain region layer. This provides column bars between the column isolation trenches. Further, a plurality of substantially parallel row isolation trenches are formed orthogonal to the column isolation trenches and extending to substantially the same depth as the column isolation trenches. This produces an array of vertical access transistors for the memory array. The row and column isolation trenches are filled with a conductive material to a level that does not exceed the lower level of the body region so as to provide a common plate for capacitors of the memory cells of the memory array. Two conductive wordlines are formed in each row isolation trench to selectively interconnect alternate access transistors on opposite sides of the row isolation trench. Finally, bit lines are formed to selectively interconnect the second source/drain regions of the access transistors on each column.

BRIEF DESCRIPTION OF THE DRAWINGS

FIGS. 5A through 5M are perspective and elevational views of an embodiment of an integrated circuit that illustrate processing steps for fabricating the integrated circuit according to the teachings of the present invention.

DETAILED DESCRIPTION OF THE INVENTION

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and logical, mechanical and electrical changes may be made without departing from the scope of the present invention. The following detailed description is, therefore, not to be taken in a limiting sense.

In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Figure 1:
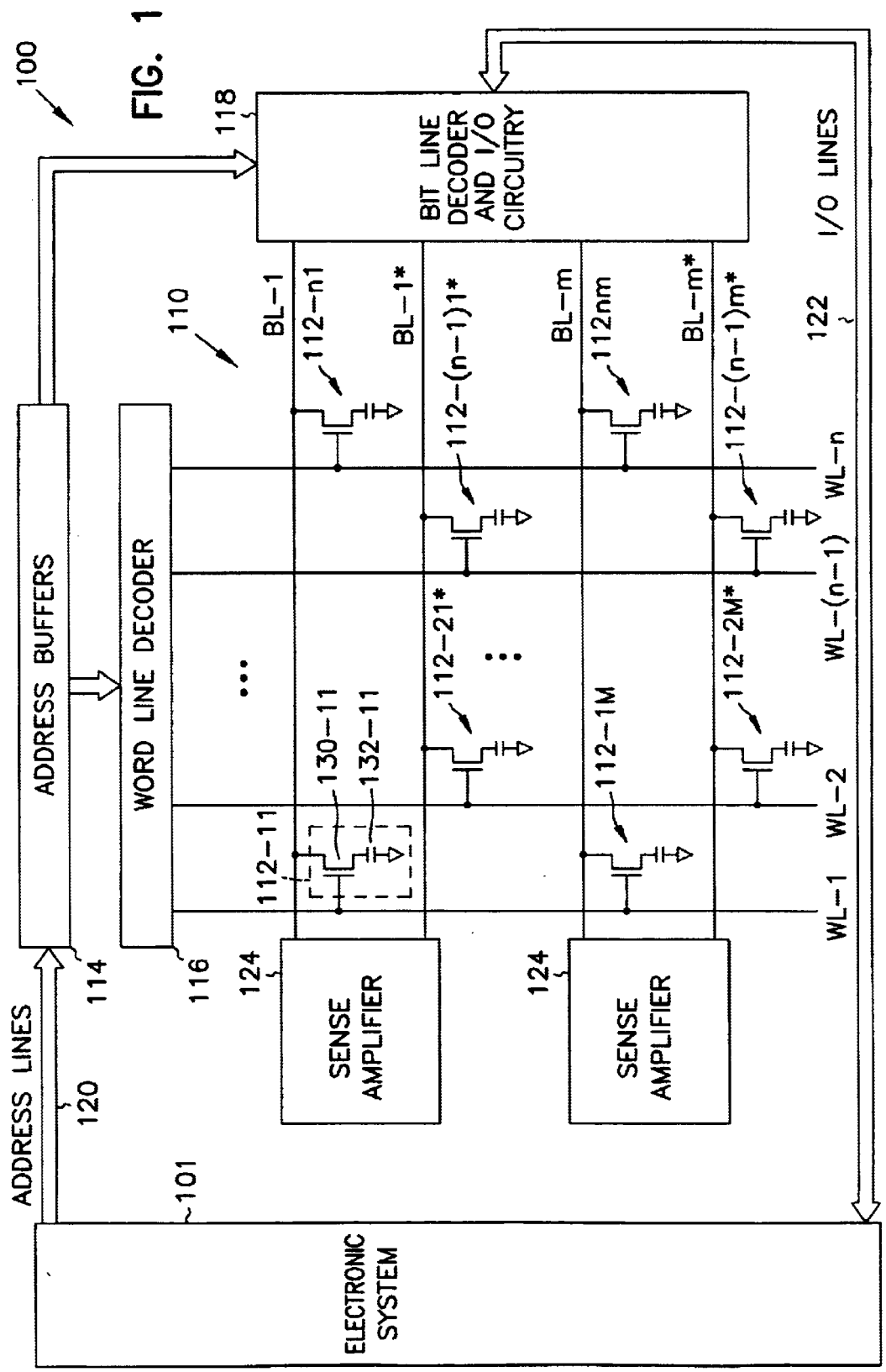
FIG. 1 is a block/schematic diagram of an illustrative embodiment of the present invention that includes a memory device that is coupled to an electronic system.

FIG. 1 is a block/schematic diagram that illustrates generally one embodiment of a memory device 100 incorporating an array of memory cells constructed according to the teachings of the present invention. Memory device 100 is coupled to electronic system 101. Electronic system 101 may comprise, for example, a microprocessor, a memory controller, a chip set or other appropriate electronic system. Memory device 100 illustrates, by way of example but not by way of limitation, a dynamic random access memory (DRAM), in a folded bit line configuration. Memory device 100 includes array 110 with N word lines and M complementary bit line pairs. Array 110 further includes memory cells 112-*ij*, where i refers to the word line of the cell and j refers to the bit line of the cell. It is noted that an asterisk (*) is used to indicate a cell that is associated with a complementary bit line.

In the exemplary embodiment of FIG. 1, each of memory cells 112-*ij* has a substantially identical structure, and accordingly, only one memory cell is described herein. These memory cells 112-*ij* include a vertical transistor where one plate of a capacitor is integral with the transistor.

The vertical transistors are laid out in a substantially checker-board pattern of rows and columns on a substrate. Memory cell 112-11 includes vertical transistor 130-11. A source/drain region of transistor 130-11 is formed in a deep trench and extends to a sufficient depth to form a storage node of storage capacitor 132-11. The other terminal of storage capacitor 132-11 is part of a mesh or grid of poly-silicon that surrounds the source/drain region of transistor 130-11 and is coupled to ground potential.

The N word lines, WL-1 through WL-N, are formed in trenches that separate adjacent rows of vertical transistors 130-*ij*. Each trench houses two word lines, with each word line in a trench acting as a gate for alternate transistors on one side of the trench.

Bit lines BL-1 through BL-M are used to write to and read data from memory cells 112-*ij* in response to addressing circuitry. For example, address buffer 114 is coupled to control bit line decoder 118, which also includes sense amplifiers and input/output circuitry that is coupled to bit lines BL-1 through BL-M and complement bit lines BL-1* through BL-M* of array 110. Address buffer 114 also is coupled to control word line decoder 116. Word line decoder 116 and bit line decoder 118 selectably access memory cells 112-*ij* in response to address signals that are provided on address lines 120 from electronic system 101 during write and read operations.

In operation, memory 100 receives an address of a particular memory cell at address buffer 114. For example, electronic system 101 may provide address buffer 114 with the address for cell 112-11 of array 110. Address buffer 114 identifies word line WL-1 for memory cell 112-11 to word line decoder 116. Word line decoder 116 selectively activates word line WL-1 to activate access transistor 130-1*j* of each memory cell 112-1*j* that is connected to word line WL-1. Bit line decoder 118 selects bit line BL-1 for memory cell 112-11. For a write operation, data received by input/output circuitry is coupled to bit lines BL-1 through access transistor 130-11 to charge or discharge storage capacitor 132-11 of memory cell 112-11 to represent binary data. For a read operation, bit line BL-1 of array 110 is equilibrated with bit line BL-1*. Data stored in memory cell 112-11, as represented by the charge on its storage capacitor 132-11, is coupled to bit line BL-1 of array 110. The difference in charge in bit line BL-1 and bit line BL-1* is amplified, and a corresponding voltage level is provided to the input/output circuits.

Figure 2:
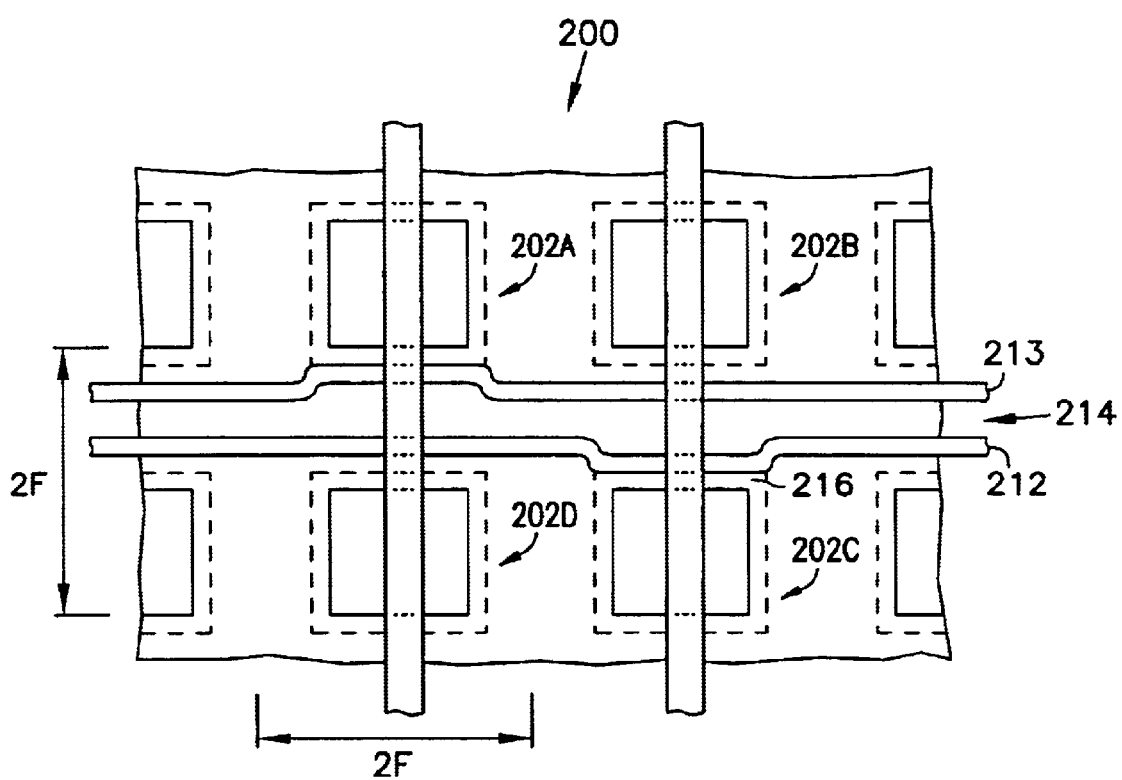
FIG. 2 is a plan view of an illustrative embodiment of a layout for a memory array according to the teachings of the present invention.
Figure 3:
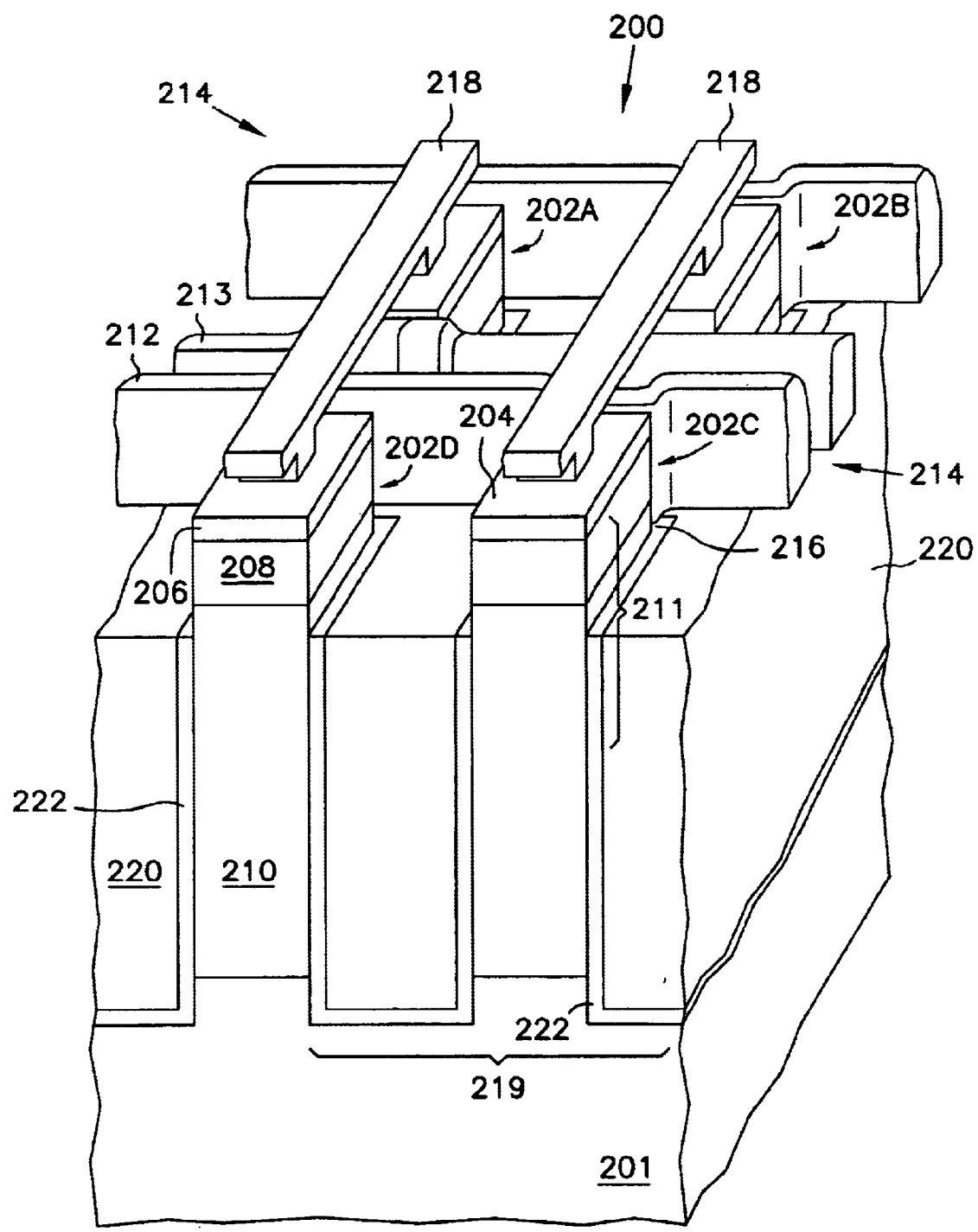
FIG. 3 is a perspective view of the illustrative embodiment of FIG. 2.
Figure 4:
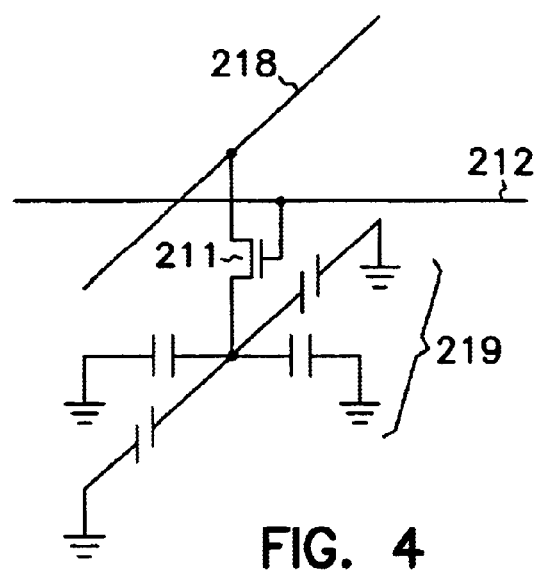
FIG. 4 is a schematic diagram of a memory cell of the embodiment of FIGS. 2 and 3.

FIGS. 2 through 4 illustrate an embodiment of a memory cell with a vertical transistor and trench capacitor for use, for example, in memory device 100 of FIG. 1. Specifically, FIG. 2 is a plan view of a layout of a number of memory cells indicated generally at 202A through 202D in array 200. FIG. 2 depicts only four memory cells. It is understood, however, that array 200 may include a larger number of memory cells even though only four are depicted here. Each memory cell is constructed in a similar manner. Thus, only memory cell 202C is described herein in detail. Memory cell 202C includes pillar 204 of single crystal semiconductor material, e.g., silicon, that is divided into first source/drain region 206, body region 208, and second source/drain region 210 to form access transistor 211. Pillar 204 extends vertically outward from substrate 201 of, for example, p− silicon. First source/drain region 206 and second source/drain region 210 each comprise, for example, n+ silicon and body region 208 comprises P−silicon Word line 212 passes body region 208 of access transistor 211 in isolation trench 214. Word line 212 is separated from body region 208 of access transistor 211 by gate oxide 216 such that the portion of word line 212 adjacent to body region 208 operates as a gate for access transistor 211. Word line 212 may comprise, for example, n+ poly-silicon material that is deposited in isolation trench 214 using an edge-defined technique such that word line 212 is less than a minimum feature size, F, for the lithographic technique used to fabricate array 200. Passing word line 213 is also formed in trench 214. Cell 202C is coupled with cell 202B by bit line 218.

Memory cell 202C also includes storage capacitor 219 for storing data in the cell. A first plate of capacitor 219 for memory cell 202C is integral with second source/drain region 210 of access transistor 211. Thus, memory cell 202C may be more easily realizable when compared to conventional vertical transistors since there is no need for a contact between second source/drain region 210 and capacitor 219. Second plate 220 of capacitor 219 is common to all of the capacitors of array 200. Second plate 220 comprises a mesh or grid of n+ poly-silicon formed in deep trenches that surrounds at least a portion of second source/drain region 210 of each pillar 204A through 204D. Second plate 220 is grounded by contact with substrate 201 underneath the trenches. Second late 220 is separated from source/drain region 210 by gate oxide 222.

With this construction for memory cell 202C, access transistor 211 is like a silicon on insulator device. Three sides of the transistor are insulated by thick oxide in the shallow trench. If the doping in pillar 204 is low and the width of the post is sub-micron, then body region 208 can act as a "fully-depleted" silicon on insulator transistor with no body or substrate to contact. This is desirable to avoid floating body effects in silicon on insulated transistors and is achievable due to the use of sub-micron dimensions in access transistor 211.

FIG. 4 is a schematic diagram that illustrates an effective circuit diagram for the embodiment of FIGS. 2 and 3. It is noted that storage capacitor 219 formed by first source/drain region 210 and second plate 220 is depicted as four separate capacitors. This represents that the first plate 220 surrounds second source/drain region 210 which increases the charge storage capacitance and stored charge for the memory cell. It is also noted that second plate 220 is maintained at a constant potential, e.g., ground potential.

As shown in FIG. 2, the memory cells of array 200 are four-square feature ($4F^2$) memory cells. Using cell 202D as an example, the surface area of cell 202D is calculated based on linear dimensions in the bit line and word line directions. In the bit line direction, the distance from one edge of cell 202D to a common edge of adjacent cell 202A is approximately 2 minimum feature sizes (2F). In the word line direction, the dimension is taken from the midpoint of isolation trenches on either side of memory cell 202D. Again, this is approximately two minimum feature sizes (2F). Thus, the size of the cell is $4F^2$. This size is much smaller than the current cells with stacked capacitors or trenched capacitors.

FIGS. 5A through 5M illustrate one embodiment of a process for fabricating an array of memory cells, indicated generally at 299, according to the teachings of the present invention. In this example, dimensions are given that are appropriate to a 0.2 micrometer lithographic image size. For other image sizes, the vertical dimensions can be scaled accordingly.

Figure 5A:
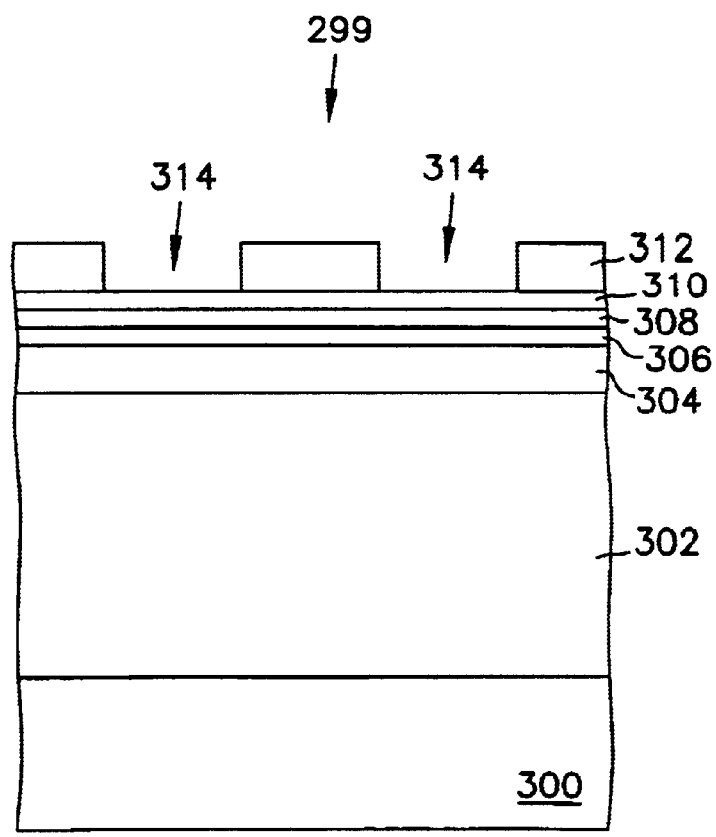

As shown in FIG. 5A, the method begins with substrate 300. Substrate 300 comprises, for example, a P-type silicon wafer, layer of P– silicon material, or other appropriate substrate material. As shown in FIG. 5A, substrate 300 is a single unbonded substrate. Layer 302 is formed, for example, by epitaxial growth outwardly from layer 300. Layer 302 comprises single crystalline N+ silicon that is approximately 3.5 micrometers thick. Layer 304 is formed outwardly from layer 302 by epitaxial growth of single crystalline P–silicon of approximately 0.5 microns. Layer 306 is formed by ion implantation of donor dopant into layer 304 such that layer 306 comprises single crystalline N+ silicon with a depth of approximately 0.1 microns.

A thin layer of silicon dioxide ($SiO_2$), referred to as pad oxide 308, is deposited or grown on layer 306. Pad oxide 308 has a thickness of approximately 10 nanometers. A layer of silicon nitride ($Si_3N_4$), referred to as pad nitride 310, is deposited on pad oxide 308. Pad nitride 310 has a thickness of approximately 200 nanometers.

Figure 5B:
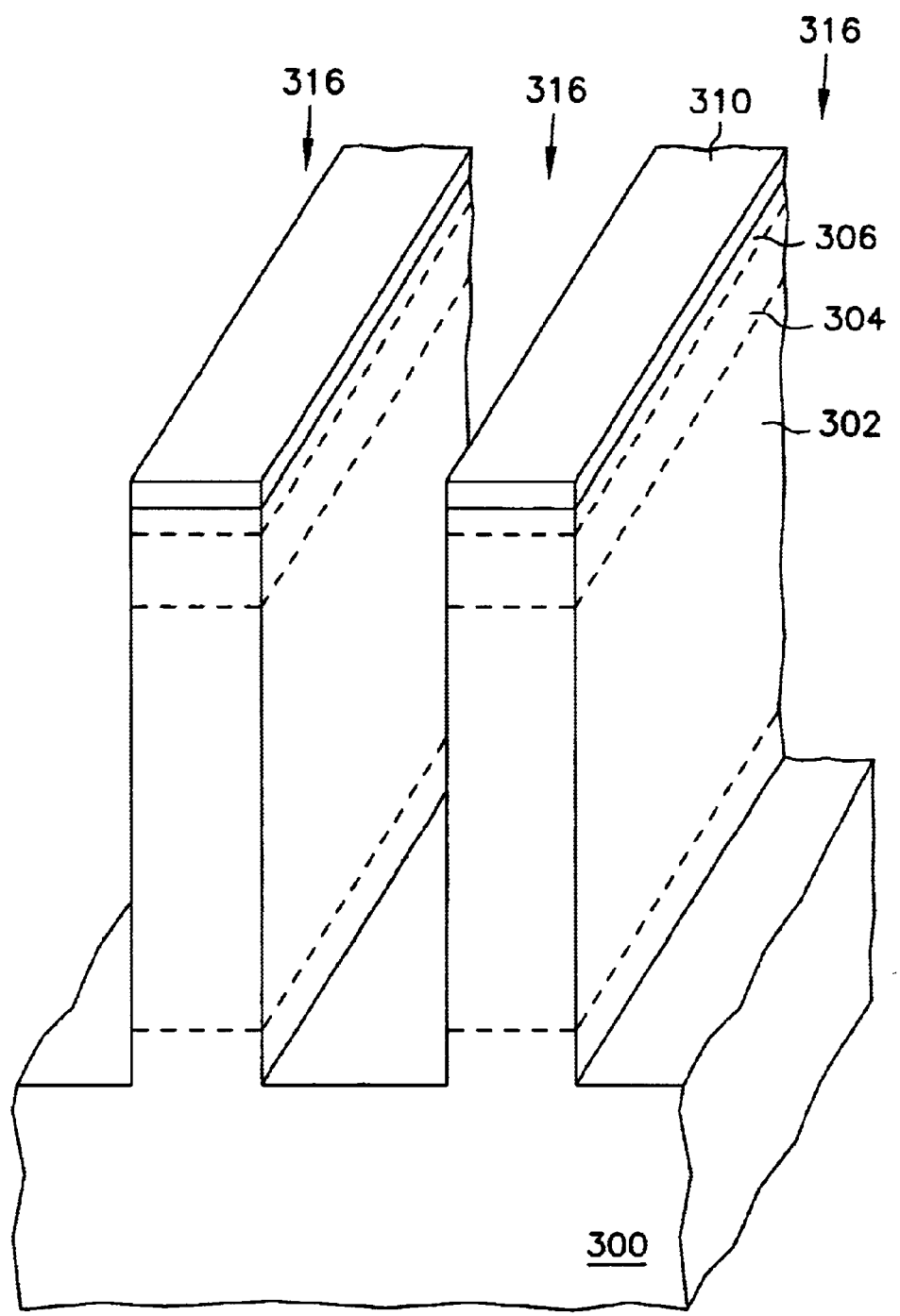
Figure 5C:
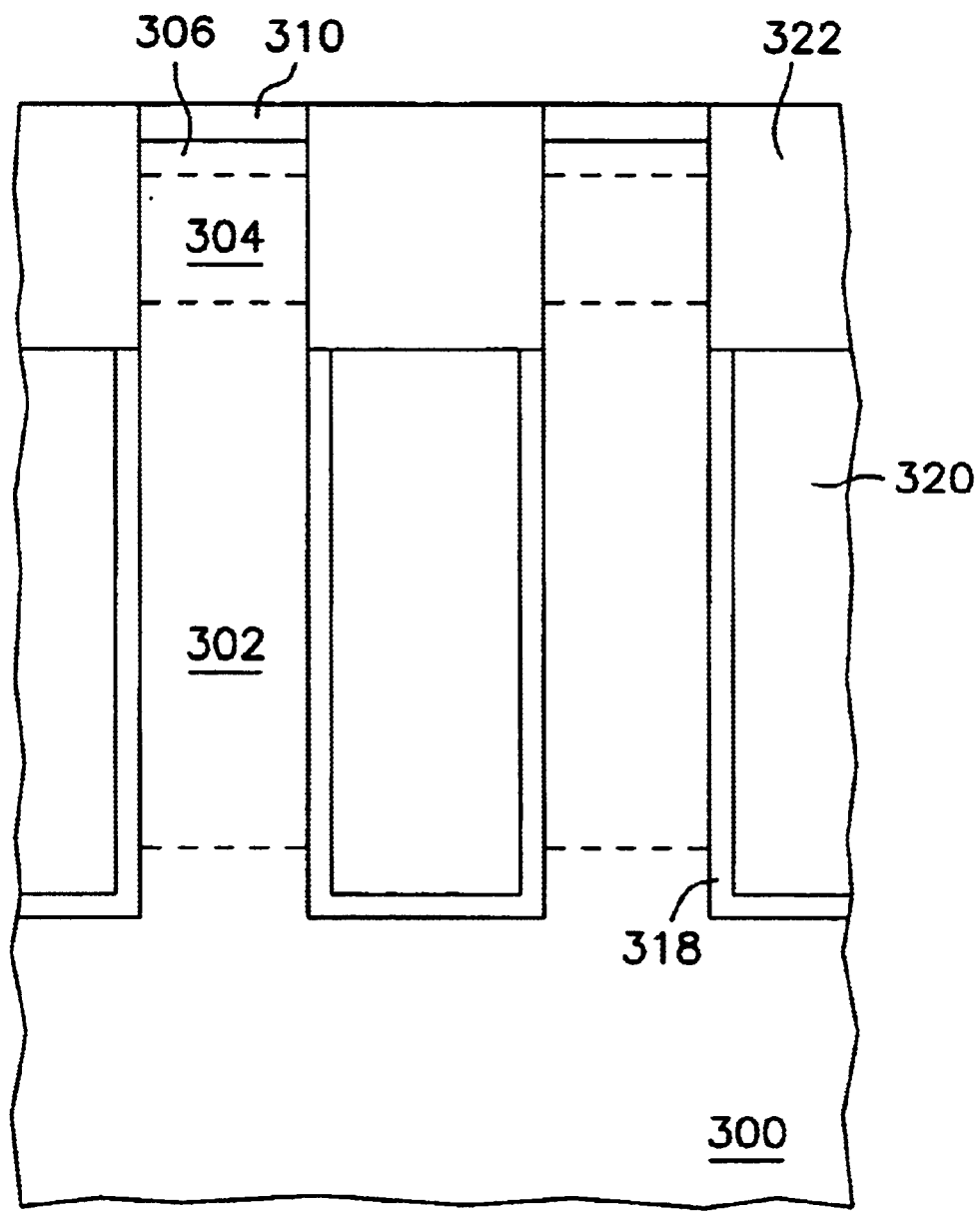

Photo resist layer 312 is deposited outwardly from layer 310. Photo resist layer 312 is patterned with a mask to define openings 314 in layer 312 to be used in selective etching. As shown in FIG. 5B, column isolation trenches 316 are etched through openings 314 in photo resist layer 312 in a direction parallel to which the bit lines will be formed. Column isolation trenches 316 extend down through nitride layer 310, oxide layer 308, N+ layer 306, P– layer 304, N+ layer 302, and into substrate 300.

A thin thermal protective oxide layer 318 is grown on exposed surfaces of substrate 300 and layers 302, 304, and 306. Layer 318 is used to protect substrate 300 and layers 302, 304 and 306 during subsequent process step.

A layer of intrinsic poly-silicon 320 is deposited by chemical vapor deposition (CVD) to fill column isolation trenches 316. Layer 320 is etched by reactive ion etching (RIE) such that layer 320 is recessed below a top of layer 302. Layer 322 of silicon nitride ($Si_3N_4$) is deposited by, for example, chemical vapor deposition to fill trenches 316. Layer 322 is planarized back to a level of layer 310 using, for example, chemical mechanical polishing (CMP) or other suitable planarization technique to produce the structure shown in FIG. 5C.

Figure 5D:
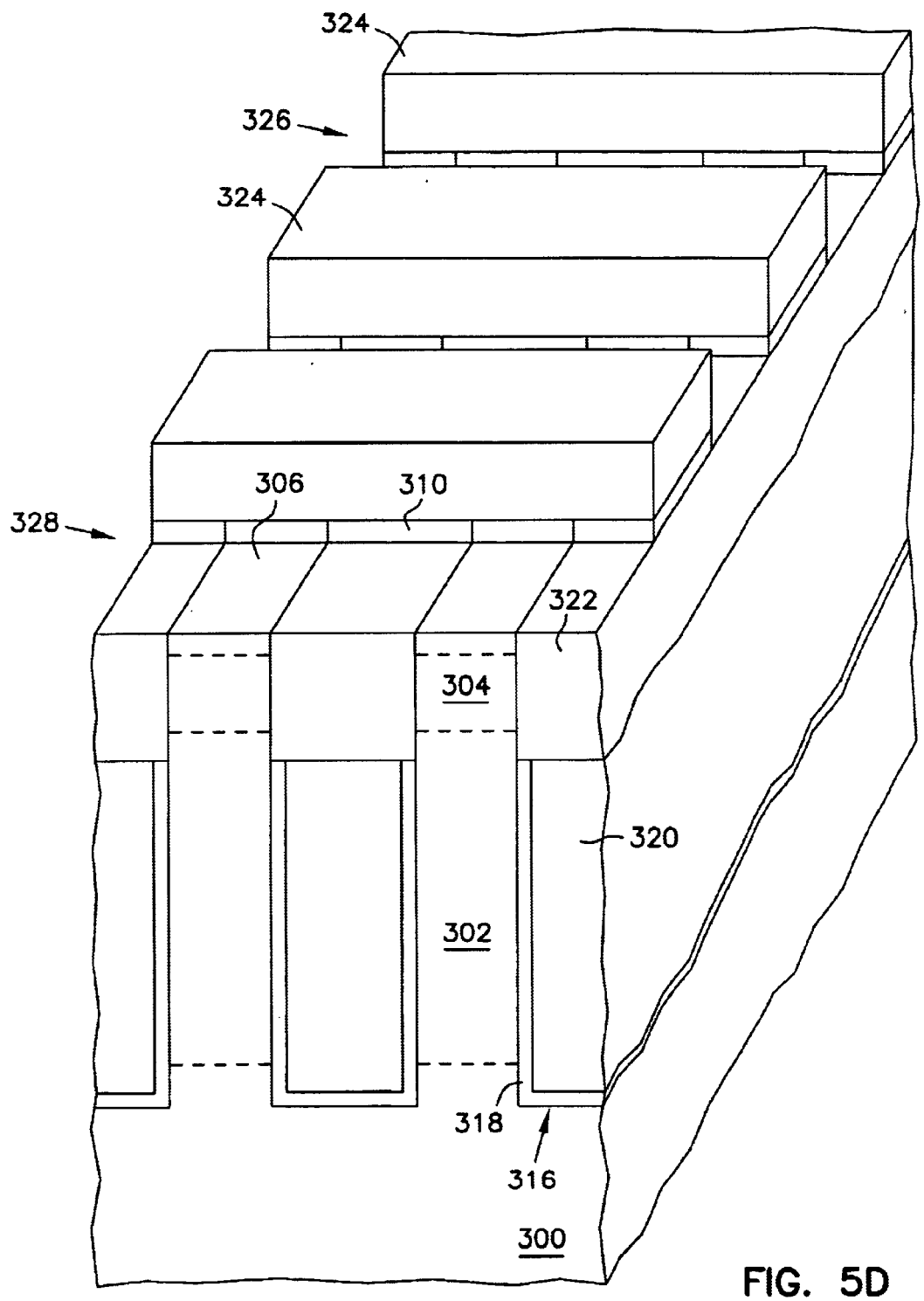

As shown in FIG. 5D, layer 324 of photo resist material is deposited outwardly from nitride layers 322 and 310. Layer 324 is exposed through a mask to define openings 326 in layer 324. Openings 326 are orthogonal to trenches 316 that were filled by intrinsic poly-silicon layer 320 and nitride layer 322. Next, nitride layers 310 and 322 are etched to a depth sufficient to expose a working surface 328 of layer 306. It is noted that at this point layer 320 of intrinsic poly-silicon is still covered by a portion of nitride layer 322.

Figure 5E:
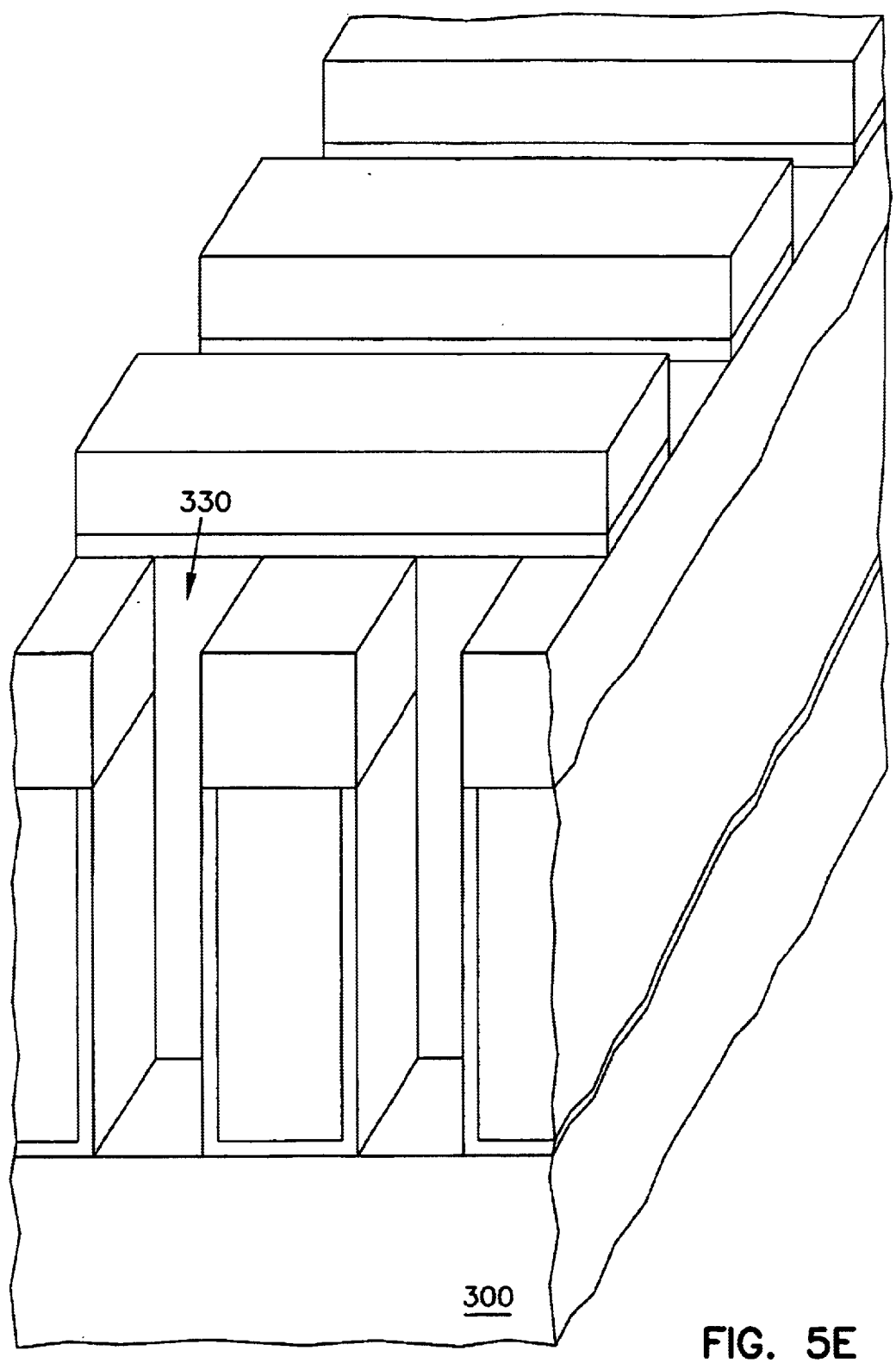

As shown in FIG. 5E, the portion of layers 306, 304, and 302 that are exposed in openings 326 are selectively etched down to a distance approximately equal to column isolation trenches 316. A thin thermal protective oxide is grown on the exposed silicon of layers 302, 304 and 306 as well as an exposed upper surface of layer 300. This oxide layer is labeled 330 in FIG. 5E.

Figure 5F:
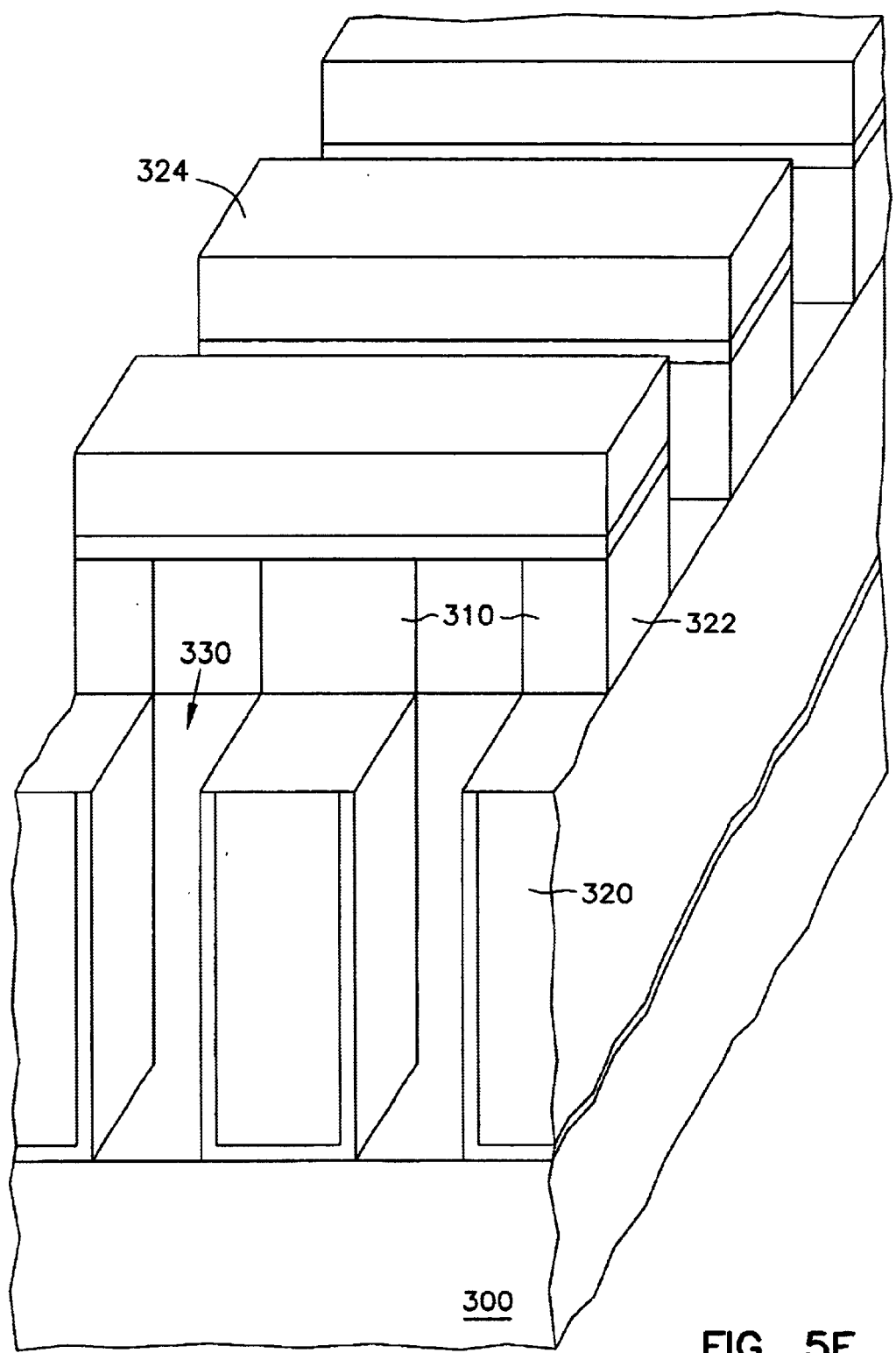
Figure 5G:
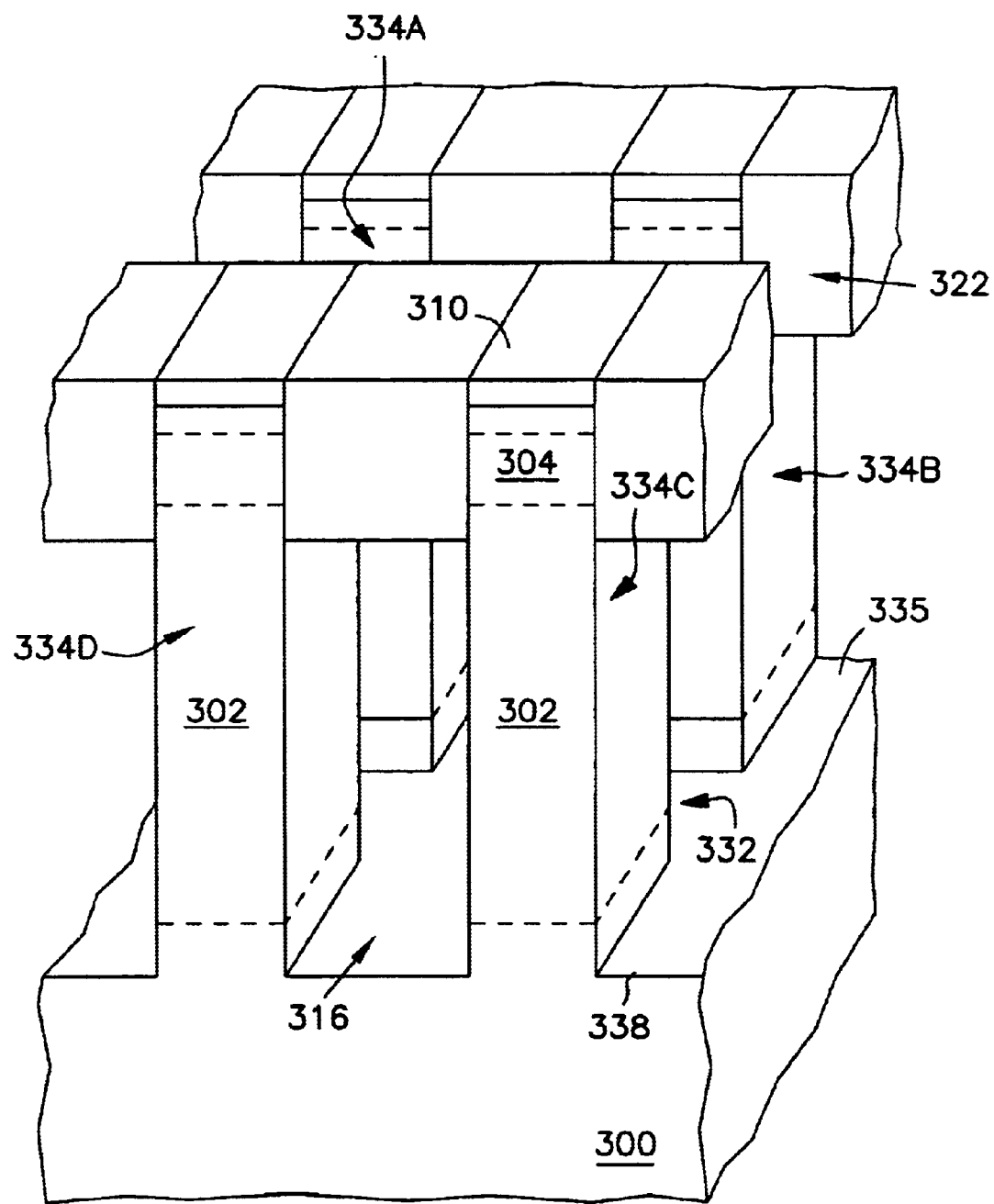

As shown in FIG. 5F, the remaining nitride layer 322 exposed in openings 326 is directionally etched to expose layer of intrinsic poly-silicon 320. It is noted that nitride layer 322 and nitride layer 310 remain intact under the photo resist layer 324. Layer of intrinsic poly-silicon 320 is next isotropically etched using a silicon etchant which does not attack oxide or nitride layers. Next, an isotropic oxide etch is performed to remove all exposed thin oxide. The photo resist layer 324 is removed. At this point, the method has produced the structure shown in FIG. 5G. This structure includes a nitride bridge formed from nitride layers 310 and 322 that extends orthogonal to column isolation trenches 316 and covers the remaining portions of layers 302, 304, and 306. The structure also includes row isolation trenches 322 that are orthogonal to column isolation trenches 316. The structure of FIG. 5G also includes pillars 334A through 334D of single crystal silicon material. Pillars 334A through 334D form the basis for individual memory cells for the memory array formed by the process.

An optional metal contact 336 may be formed by, for example, deposition of a collimated refractory metal deposition, e.g., titanium, tungsten, or a similar refractory metal. This provides an ohmic metal contact for a capacitor plate on a surface 335 of substrate 300.

Dielectric layer 338 is deposited or grown on sidewalls of layer 302 of pillars 334A through 334D. Layer 338 acts as the dielectric for the storage capacitors of array 299 of memory cells. If contact 336 was previously deposited on a surface of substrate 300, dielectric layer 338 should be directionally etched to clear dielectric material from the bottom of row isolation trench 332.

Figure 5H:
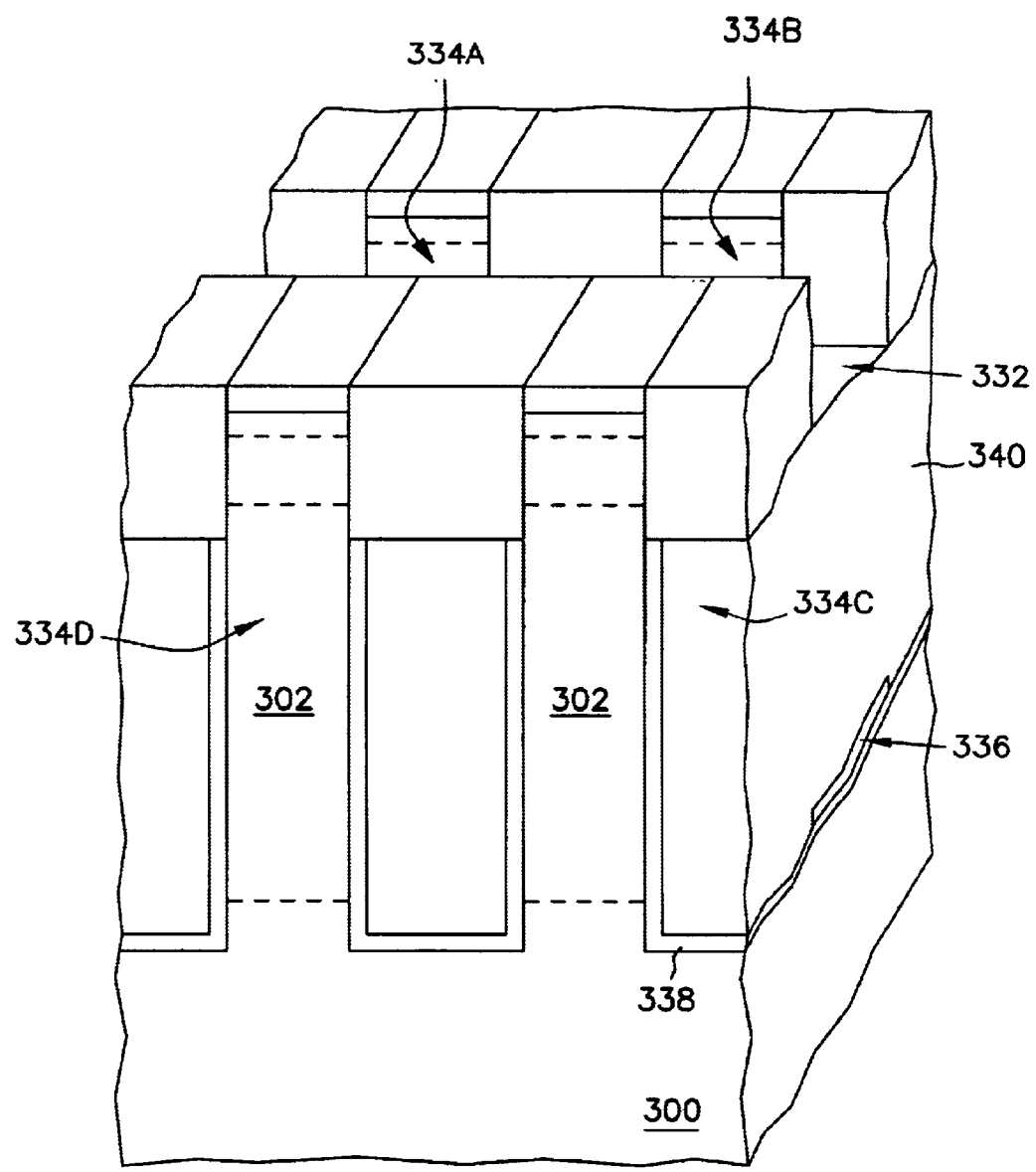
Figure 51:
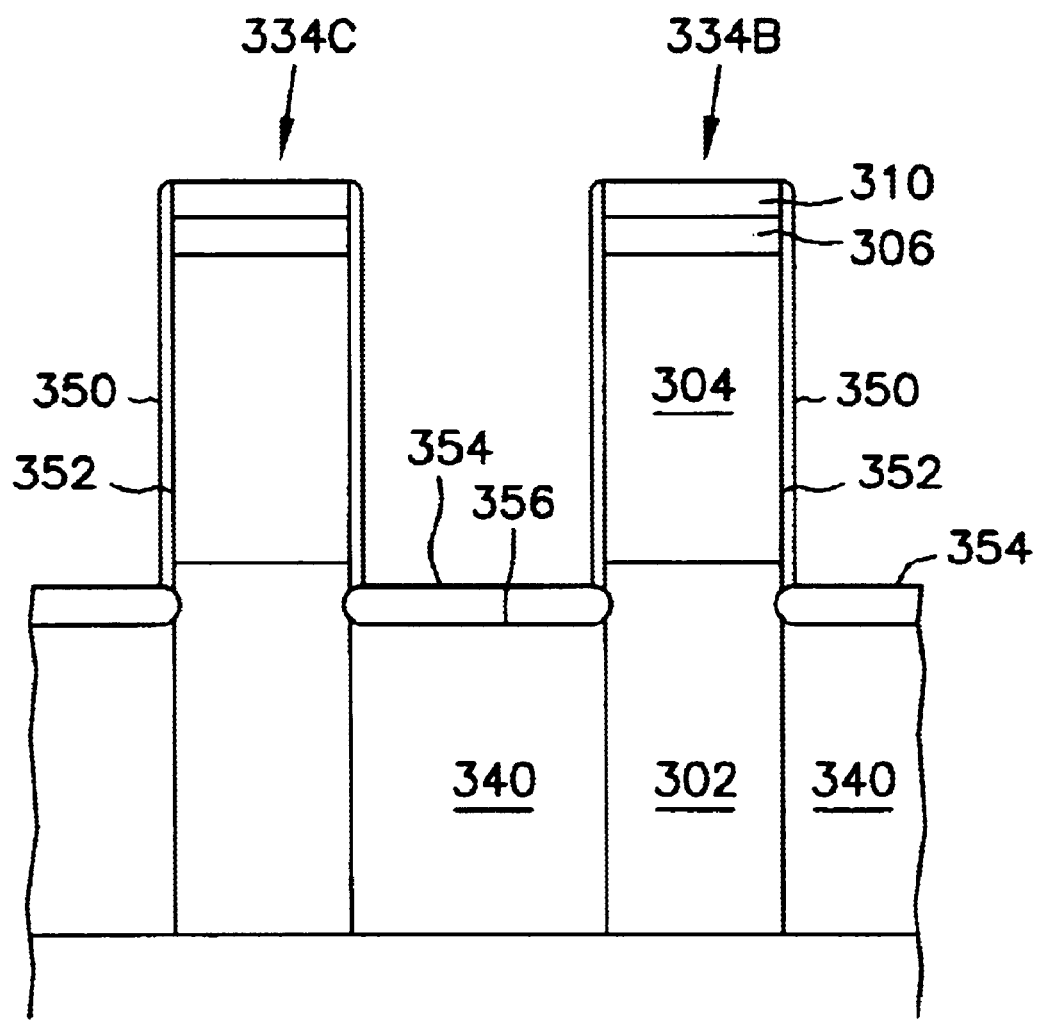

Next, a common plate for all of the memory cells of array 299 is formed by a chemical vapor deposition of N+ poly-silicon or other appropriate refractory conductor in column isolation trenches 316 and row isolation trenches 322. In this manner, conductor mesh or grid 340 is formed so as to surround each of pillars 334A through 334D. Mesh 340 is planarized and etched back to a level approximately at the bottom of the nitride bridge formed by nitride layers 322 and 310 as shown in FIG. 5H. An additional etch is performed to remove any remaining exposed capacitor dielectric of layer 338 from the sides of semiconductor pillars 334A through 334D.

Referring to FIG. 5I, layer 350 of silicon nitride ($Si_3N_4$) is formed by, for example, chemical vapor deposition to a thickness of approximately 20 nanometers. Layer 350 is directionally etched to leave silicon nitride on sidewalls 352 of pillars 344B and 344C as shown in FIG. 5I. It is noted that silicon nitride is also deposited on the sidewalls of pillars 334A and 334B. Layer 354 of thermal silicon dioxide ($SiO_2$) is grown or deposited to a depth of approximately 100 nanometers on exposed surfaces 356 of mesh 340. Layer 350 is then removed.

Figure 5J:
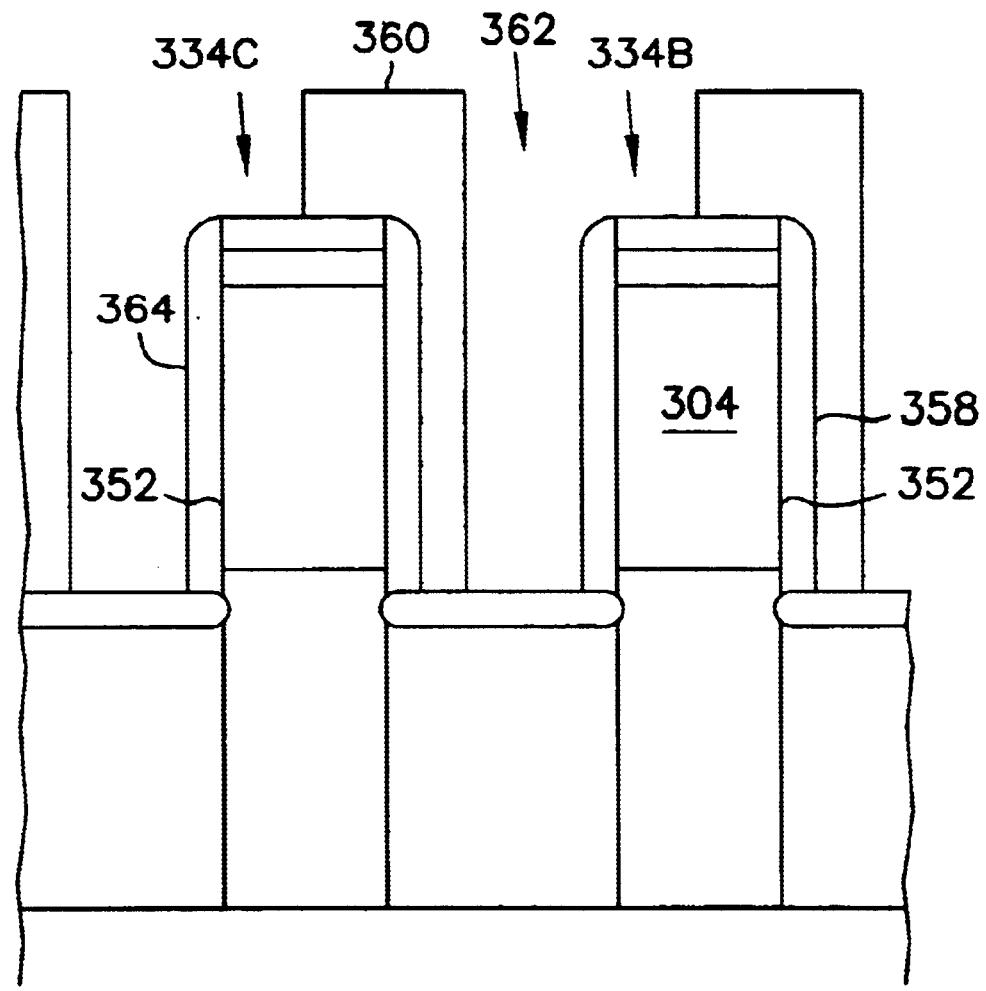

Referring to FIG. 5J, layer 358 of intrinsic poly-silicon is deposited, for example, by chemical vapor deposition with a thickness of approximately 50 nanometers. Layer 358 is directionally etched to the leave intrinsic poly-silicon on sidewalls 352 of pillars 334B and 334C as shown in FIG. 5J. It is noted that layer 358 is also formed on pillars 334A and 334D.

Figure 5K:
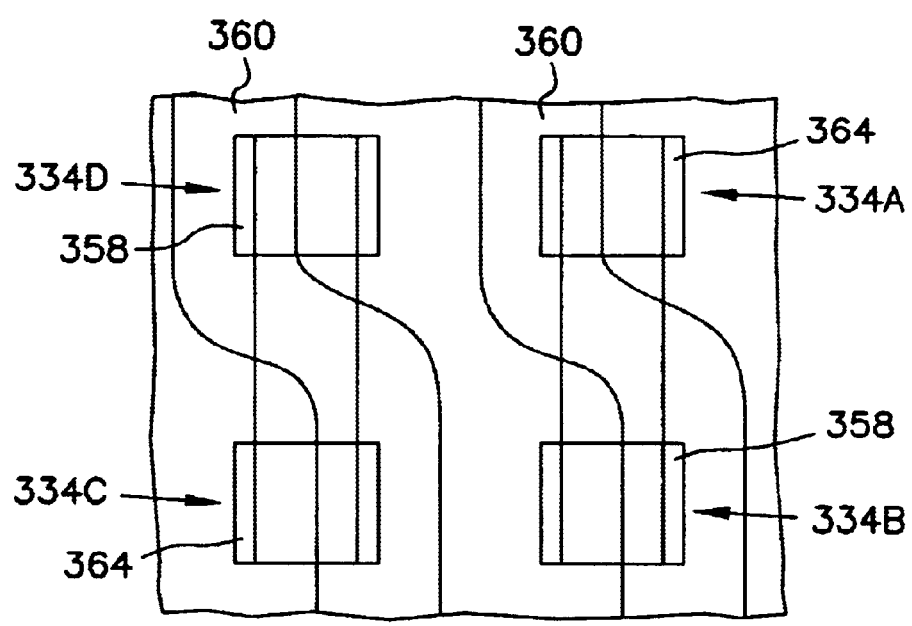

As shown in FIGS. 5J and 5K, layer 360 of photo resist material is deposited and masked to expose alternate sidewalls 352 of pillars 334A through 334D. Exposed portions of layer 358 in openings 362 through photo resist layer 360 are selectively etched to expose sidewalls 352 of pillars 334A through 334D. Photo resist layer 360 is removed and gate oxide layer 364 is grown on exposed sidewalls 352 of pillars 334A through 334D. Additionally, gate oxide layer 364 is also deposited on remaining intrinsic poly-silicon layers 358.

Figure 5L:
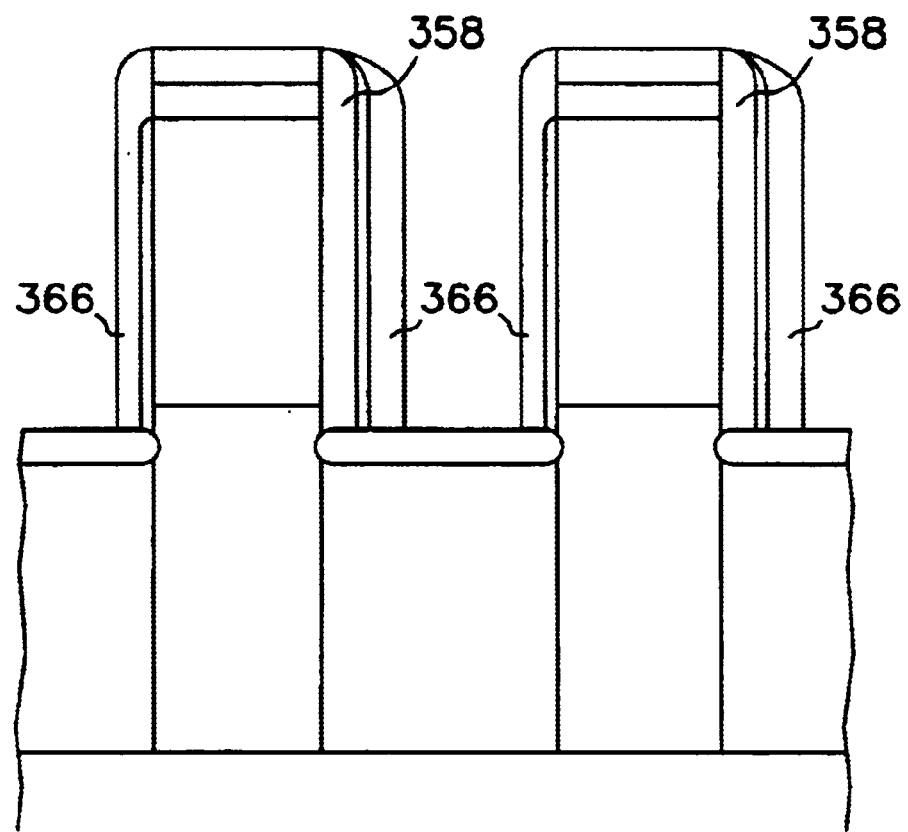
Figure 5M:
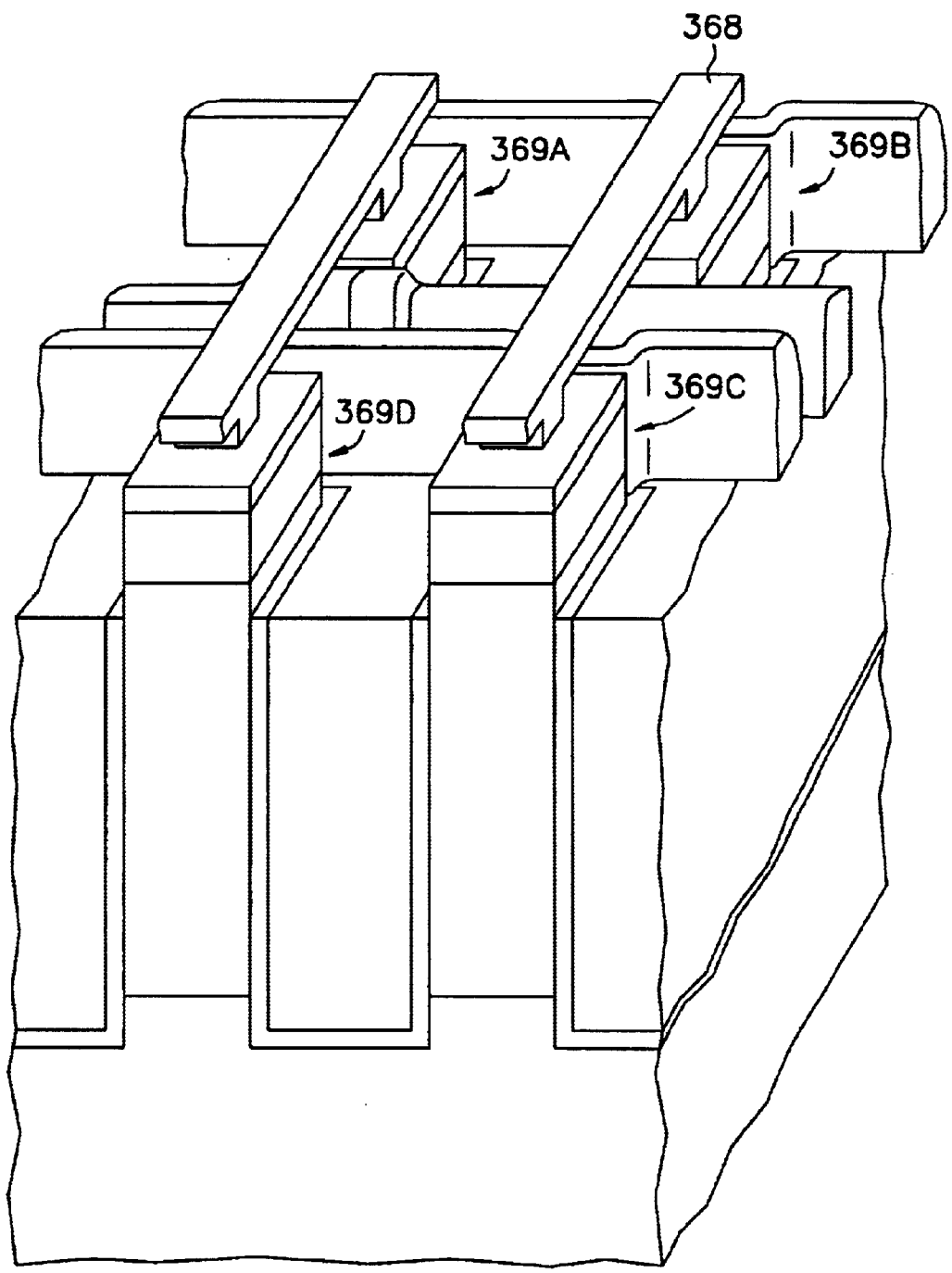

Referring to FIG. 5L, word line conductors 366 are deposited by, for example, chemical vapor deposition of n+ poly-silicon or other refractory metal to a thickness of approximately 50 nanometers. Conductors 366 are directionally and selectively etched to leave on sidewalls 352 of pillars 334A through 334D and on exposed surfaces of intrinsic poly-silicon layer 358.

Next, a brief oxide etch is used to expose the top surface of intrinsic poly-silicon layer 358. Layer 358 is then selectively etched to remove the remaining intrinsic poly-silicon using an etchant such as KOH and alcohol, ethylene and pyrocatechol or gallic acid (as described in U.S. Pat. No. 5,106,987 issued to W. D. Pricer). Next, an oxide layer is deposited by, for example, chemical vapor deposition to fill the space vacated by layer 358 and to fill in between word line conductors 366. Additionally conventional process steps are used to add bit lines 368 so as to produce the structure shown in FIG. 5M including memory cells 369A through 369D.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the semiconductor materials and dimensions specified in this application are given by way of example and not by way of limitation. Other appropriate material can be substituted without departing from the spirit and scope of the invention.

What is claimed is:

1. A method of fabricating a memory array, the method comprising:
   forming from a single unbonded substrate a number of access transistors separated by trenches, each access transistor formed in a pillar of semiconductor material that extends outwardly from the single unbonded substrate wherein each access transistor includes, in order, a first source/drain region, a body region and a second source/drain region formed vertically thereupon;
   filling the trenches with a polysilicon layer, the polysilicon layer having a top surface below a top surface of the body region;
   forming a nitride layer over the access transistors and the polysilicon layer;
   removing first portion of the nitride layer and the entire polysilicon layer to form a plurality of bridges, each of the bridges including second portion of the nitride layer, each of the bridges extending through a column of access transistors;
   forming a trench capacitor in the trenches, wherein a first plate of the trench capacitor is integral with the first source/drain region of the access transistor, wherein the trench capacitor is formed directly on the single unbonded substrate;
   forming a number of word lines in the trenches that separate adjacent rows of access transistors, wherein each trench includes two word lines with a gate of each word line interconnecting alternate access transistors on opposite sides of the trench;
   forming a number of bit lines that interconnect second source/drain regions of selected access transistors.

2. The method of claim 1, wherein forming a trench capacitor further includes forming a second plate that surrounds the first plate.

3. The method of claim 1, and further comprising forming a contact that couples a second plate of the trench capacitor to an underlying layer.

4. The method of claim 1, where forming a trench capacitor comprises forming a second plate that forms a grid pattern in a layer of material such that the grid surrounds each of the pillars that form the access transistors.

5. The method of claim 1, wherein forming a trench capacitor comprises depositing poly-silicon in crossing row and column isolation trenches formed around the pillars that define the access transistors.

6. The method of claim 1, wherein the memory array comprises memory cells each occupying an area of 4F2, wherein F is a minimum feature size.

7. The method of claim 1, wherein the first source/drain region is N+ doped.

8. The method of claim 7, including forming the first source/drain region to a thickness of approximately 3.5 micrometers.

9. The method of claim 7, wherein the body region is P– doped.

10. The method of claim 9, including forming the body region by epitaxial growth of single-crystalline P– silicon to a thickness of approximately 0.5 microns.

11. The method of claim 9, wherein the second source/drain region is N+ doped.

12. The method of claim 11, including forming the second source/drain region by implanting the N+ dopant to a depth of approximately 0.1 microns.

13. A method of fabricating a memory array, the method comprising:

epitaxially forming a first conductivity type first source/drain region layer on an unbonded substrate;

epitaxially forming a second conductivity type body region layer on the first source/drain region layer;

forming a first conductivity type second source/drain region layer on the body region layer;

forming a plurality of substantially parallel column isolation trenches extending through the second source/drain region layer, the body region layer, and the first source/drain region layer, thereby forming column bars between the column isolation trenches;

filling the column isolation trenches with a polysilicon layer, the polysilicon layer having a top surface below a top surface of the body region layer;

forming a nitride layer over the column bars and the polysilicon layer;

removing a first portion of the nitride layer and the entire polysilicon layer to form a plurality of substantially parallel row isolation trenches, orthogonal to the column isolation trenches, extending to substantially the same depth as the column isolation trenches, thereby forming an array of vertical access transistors for the memory array, wherein the removing the first portion of the nitride layer the entire polysilicon layer also forms a plurality of bridges orthogonal to the column isolation trenches, each of the bridges including a second portion of the nitride layer, each of the bridges extending through a column of vertical access transistors;

filling the row and column isolation trenches with a conductive material to a level that does not exceed the lower level of the body region so as to provide a common plate for capacitors of memory cells of the memory array, wherein the capacitors are formed directly on the unbonded substrate;

forming two conductive word lines in each row isolation trenches that selectively interconnect alternate vertical access transistors on opposite sides of the row isolation trench; and forming bit lines that selectively interconnect the second source/drain regions of the vertical access transistors on each column.

14. The method of claim 13, wherein forming the first conductivity type source/drain region layer on the unbonded substrate comprises forming the first conductivity type first source/drain region layer outwardly from the unbonded substrate to a distance sufficient for the first source/drain region layer to also function as a first plate of the capacitor for each memory cell in the array.

15. The method of claim 13, wherein the memory array comprises memory cells each occupying an area of 4F2, wherein F is a minimum feature size.

16. The method of claim 13, wherein the first source/drain region is N+ doped.

17. The method of claim 13, including forming the first source/drain region to a thickness of approximately 3.5 micrometers.

18. The method of claim 13, wherein the unitary body region is P− doped.

19. The method of claim 18, including forming the body region by epitaxial growth of single-crystalline P− silicon to a thickness of approximately 0.5 microns.

20. The method of claim 18, wherein the second source/drain region is N+ doped.

21. The method of claim 20, including forming the second source/drain region by implanting the N+ dopant to a depth of approximately 0.1 microns.

22. A method of forming an array of memory cells, the method comprising:

forming using a single unbonded substrate a plurality of isolated vertical access transistors separated by trenches, the isolated vertical access transistors comprising in order outward from the single unbonded substrate, a first source drain region, a body region and a second source/drain region, wherein the separation of trenches is such that the area occupied by each memory cell is 4F2, wherein F is a minimum feature size;

filling the trenches with a polysilicon layer, the polysilicon layer having a top surface below a top surface of the body region;

forming a nitride layer over the isolated vertical access transistors and the polysilicon layer;

removing a first portion of the nitride layer and the entire polysilicon layer to form a plurality of bridges, each of the bridges including a second portion of the nitride layer, each of the bridges extending through a column of isolated vertical access transistors;

forming a trench capacitor for each memory cell, wherein a portion of the first source/drain region serves as a first plate of the capacitor, the trench capacitor is formed directly on the single unbonded substrate;

forming two word lines in select trenches, with a gate of each word line interconnecting alternate isolated vertical access transistors on opposite sides of the trench; and forming bit lines that interconnect select second source/drain regions.

23. The method of claim 22, wherein the first source/drain region is N+ doped.

24. The method of claim 22 including forming the first source/drain region to a thickness of approximately 3.5 micrometers.

25. The method of claim 23, wherein the body region is P− doped.

26. The method of claim 24, including forming the body region by epitaxial growth of single-crystalline P− silicon to a thickness of approximately 0.5 microns.

27. The method of claim 25, wherein the second source/drain region is N+ doped.

28. The method of claim 27, including forming the second source/drain region by implanting the N+ dopant to a depth of approximately 0.1 microns.

29. The method of claim 22, wherein forming the trench capacitor further includes forming a second plate that surrounds the first plate.

30. A method of forming an array of memory cells, the method comprising:

forming with a single unbonded substrate a first layer of a first conductivity type of single crystalline silicon, a second layer of a second conductivity type of single crystalline silicon, and a third layer of the first type of single crystalline silicon atop the second layer;

selectively etching through the third through first layers and partially into the single unbonded substrate so as to form a plurality of trenches and pillars spaced apart such that the surface area occupied by each memory cell is 4F2, wherein F is a minimum feature size;

filling the trenches with a polysilicon layer, the polysilicon layer having a top surface below a top surface of the second layer;

forming a nitride layer over the pillars and the polysilicon layer;

removing a first portion of the nitride layer and the entire polysilicon layer to form a plurality of bridges, each of the bridges including a second portion of the nitride layer, each of the bridges extending through a column of pillars;

filling the trenches with a conductive material so as to provide for a common plate for capacitors associated with each memory cell, such that a portion of the first layer in each pillar serves as a plate for the capacitor, wherein the capacitors are formed directly on the single unbonded substrate;

electrically interconnecting select pillars by word lines electrically coupled to the second layer of the select pillars, wherein each of the trenches includes two word lines; and electrically interconnecting the select pillars by bit lines electrically coupled to the third layer of the select pillars.

31. A method according to claim 27, wherein the first conductivity type is N+ and the second conductivity type is P−.

32. A method of fabricating an array of memory cells, the method comprising:

forming, using a single unbonded substrate, spaced apart access transistors isolated by trenches, each access transistor comprising in order from the single unbonded substrate outward, an N+− doped first source/drain region, a P− doped body region and an N+− doped second source/drain region;

filling the trenches with a polysilicon layer, the polysilicon layer having a top surface below a top surface of the body region;

forming a nitride layer over the access transistors and the polysilicon layer;

removing a first portion of the nitride layer and the entire polysilicon layer to form a plurality of bridges, each of the bridges including a second portion of the nitride layer, each of the bridges extending through a column of the access transistors;

forming capacitors in the trench corresponding to each access transistor, wherein a portion of the N+− doped first source/drain region adjacent the single unbonded substrate serves as a plate for the capacitor corresponding to each access transistor, wherein the capacitors are formed directly on the single unbonded substrate; and electrically connecting the access transistors in a manner that allows for an electrical charge to be accessed or stored in each capacitor via the corresponding access transistor, wherein each of the trenches includes two word lines selectively connected to the access transistors.

33. A method according to claim 32, wherein electrically connecting the access transistors includes:

forming a number of bit lines that interconnect second source/drain regions of selected access transistors.

34. A method of forming a memory device having an array of memory cells and a minimum feature size F, comprising:

forming using a single unbonded substrate a plurality of vertical access transistors separated by trenches and laid out in a substantially checker-board pattern such that the memory cells occupy an area of 4F2, wherein the formation of the vertical access transistors consists of forming a first source/drain region of a first dopant type, forming a body region of a second dopant type atop the first source/drain region, and forming a second source/drain region of a second dopant type atop the body region;

filling the trenches with a polysilicon layer, the polysilicon layer having a top surface below a top surface of the body region;

forming a nitride layer over the vertical access transistors and the polysilicon layer;

removing a first portion of the nitride layer and the entire polysilicon layer to form a plurality of bridges, each of the bridges including a second portion of the nitride layer, each of the bridges extending through a column of vertical access transistors;

forming a capacitor in the trenches by lining the trench with a gate oxide, and then filling the trench with polysilicon of the first type so as to surround a portion of the first source/drain region such that the surrounded portion of the first source/drain region serves as a first plate of the capacitor and the polysilicon in the trench serves as a second plate of the capacitor, wherein the capacitor is formed directly on the single unbonded substrate; and electrically connecting the vertical access transistors via bit lines and word lines so as to provide the capability of accessing a charge stored in one or more of the capacitors or providing a charge thereto, wherein each of the trenches includes two word lines selectively connected to the vertical access transistors.

35. The method of claim 34, further including connecting the word lines to a word line decoder and the bit lines to a bit line decoder to provide selective access to the memory cells.

36. A method of forming an electronic device having an array of memory cells and a minimum feature size F, comprising:

forming with a single unbonded substrate a plurality of spaced apart access transistors each comprising in order outward from the single unbonded substrate, a first layer of N+ dopant serving as first source/drain, a second layer of P− dopant serving as a body region and a third layer of N+ dopant serving as a second source/drain region;

wherein the forming of the access transistors includes forming trenches therebetween so as to provide a memory cell area of 4F2;

filling the trenches with a polysilicon layer, the polysilicon layer having a top surface below a top surface of the body region;

forming a nitride layer over the access transistors and the polysilicon layer;

removing a first portion of the nitride layer and the entire polysilicon layer to form a plurality of bridges, each of the bridges including a second portion of the nitride layer, each of the bridges extending through a column of access transistors;

forming, for each access transistor, a capacitor in the trenches by filling the trench with a thin layer of oxide and polysilicon, such that a portion of the first source/drain, the oxide layer and the polysilicon respectively serve as a first plate, a dielectric, and a second plate for the capacitor, wherein the capacitor is formed directly on the single unbonded substrate;

electrically connecting the access transistors with word lines and bit lines, wherein each of the trenches includes two word lines selectively connected to the access transistors;

connecting the word lines to a word line decoder;

connecting the bit lines to a bit line decoder;

operatively connecting the word line and bit line decoders to an address buffer; and interfacing the address buffer to an electronic system via address lines.

37. The method of claim 36, wherein the electronic system is a microprocessor.

38. A method comprising:

growing a first layer over a substrate, the first layer including single crystalline silicon;

growing a middle layer over the first layer, the middle layer including single crystalline silicon;

growing a second layer over the middle layer, the second layer including single crystalline silicon;

depositing a pad layer over the second layer;

performing an etching process to form a plurality of parallel column trenches and a plurality of column bars interleaved with the column trenches, wherein the etching process includes etching the pad layer, etching the second layer, etching the middle layer, etching the first layer, and etching a portion of the substrate, and wherein each of the column bars includes a portion of the substrate, a portion of the first layer, a portion of the middle layer, a portion of the second layer, and a portion of the pad layer;

filling the column trenches with a polysilicon layer;

etching the polysilicon layer to a level below a top surface of the portion of the first layer in each of the column bars;

depositing a nitride layer over the column bars and the polysilicon layer;

planarizing the nitride layer to a level even with a surface of the portion of the pad layer of each of the column bars;

forming a photoresist layer over the nitride layer and the portion of the pad layer of each of the column bars, the photoresist layer having masked portion and openings, the each of the openings extending orthogonal to the column trenches;

etching the column bars, the nitride layer, and the polysilicon layer through the openings, wherein the etching exposes the polysilicon layer at the openings, and wherein the portion of the pad layer of each of the column bars under the masked portion and the nitride layer under the masked portion remain intact;

isotropically etching the polysilicon layer to form a plurality of row trenches orthogonal to the column trenches, a plurality of pillars arranged in column pillars parallel to the column trenches and arranged in rows pillars parallel to the row trenches, and a plurality bridges, each of the bridges connecting pillars in a column pillar, wherein each of the pillars includes a portion of the substrate, a first pillar portion formed by a part of the first layer, a middle pillar portion formed by a part of the middle layer, a second pillar portion formed by a part of the second layer, and a pad pillar portion formed by a part of the pad layer, wherein each of the bridges includes the nitride layer and the part of the pad layer in each pillar within a column pillar, and wherein each of the bridges has a bottom surface below a level of the top surface of the part of the first layer;

forming a dielectric on the substrate and on side walls of the first pillar portion of each of the pillars;

forming a conductive layer on the column trenches and the row trenches, wherein a surface of the conductive layer is at a level even with a level of the bottom surface of each of the bridges;

forming an insulation layer on the surface of the conductive layer;

forming an insulation layer on exposed side walls of each of the pillars, wherein the exposed side walls are side walls above the surface of the conductive layer;

forming at least one word line in each of the row trenches; and forming a plurality of bit lines, each of the bit lines connecting the second pillar portion of each pillar in a column pillars.

39. A method comprising:

forming a first layer over a substrate, the first layer having a first conductivity type material;

forming a middle layer over the first layer, the middle layer having a second conductivity type material;

forming a second layer over the middle layer, the second layer having a first conductivity type material;

forming a first nitride layer over the second layer;

forming a plurality of parallel column trenches and a plurality of column bars interleaved with the column trenches;

forming a polysilicon layer in the column trenches, the polysilicon layer having a top surface below a top surface of the portion of the first layer in each of the column bars;

forming a second nitride layer over the column bars and the polysilicon layer, the second nitride layer having a top surface even with a top surface of the portion of the first nitride layer of each of the column bars;

removing a portion of the second nitride layer and the entire polysilicon layer to form a plurality of row trenches orthogonal to the column trenches, a plurality of pillars arranged in column pillars parallel to the column trenches and arranged in rows pillars parallel to the row trenches, and a plurality bridges, each of the bridges connecting pillars in a column pillar, wherein each of the pillars includes a portion of the substrate, a first pillar portion formed by a part of the first layer, a middle pillar portion formed by a part of the middle layer, a second pillar portion formed by a part of the second layer, and a nitride pillar portion formed by a part of the first nitride layer, wherein each of the bridges includes a top surface even with the top even with the top surface of the part of the first nitride layer of each of the pillars, and wherein each of the bridges includes a bottom surface below a level of the top surface of the part of the first layer of each of the pillars;

forming a dielectric on the substrate and on side walls of the first pillar portion of each of the pillars;

forming a conductive layer on the column trenches and the row trenches, wherein a surface of the conductive layer is at a level even with a level of the bottom surface of each of the bridges;

forming an insulation layer on the surface of the conductive layer;

forming an insulation layer on exposed side walls of each of the pillars, wherein the exposed side walls are side walls above the surface of the conductive layer;

forming a pair of word lines in each of the row trenches; and forming a plurality of bit lines, each of the bit lines connecting the second pillar portion of each pillar in a column pillars.

40. A method comprising:

forming on a substrate a plurality of parallel column trenches and a plurality of column bars interleaved with the column trenches, wherein each of the column bars includes a portion of the substrate, a first layer, a middle layer, a second layer, and a pad layer;

forming a polysilicon layer in the column trenches, the polysilicon layer having a top surface below a top surface of the portion of the first layer in each of the column bars;

forming a nitride layer over the column bars and the polysilicon layer, the nitride layer having a top surface even with a top surface of the portion of the pad layer of each of the column bars;

removing a portion of the nitride layer the entire polysilicon layer to form a plurality of row trenches orthogonal to the column trenches, a plurality of pillars arranged in column pillars parallel to the column trenches and arranged in rows pillars parallel to the row trenches, and a plurality bridges, each of the bridges connecting pillars in a column pillar, wherein each of the pillars includes, a portion of the substrate, a the first pillar portion, formed by part of the first layer, a middle pillar portion formed by a part of the middle layer, a second pillar portion formed by a part of the second layer, and a pad portion formed by a part of the pad layer, wherein each of the bridges includes a top surface even with the top even with the top surface of the part of the pad layer of each of the pillars, and wherein each of the bridges includes a bottom surface below a level of the top surface of the part of the first layer of each of the pillars;

forming a dielectric on the substrate and on side walls of the first pillar portion of each of the pillars;

forming a conductive layer on the column trenches and the row trenches, wherein a surface of the conductive layer is at a level even with a level of the bottom surface of each of the bridges, wherein the first pillar portion, the middle pillar portion, and the second pillar portion form a source, a drain, and a body region of a vertical transistor, wherein the conductive layer and the first pillar portion of each of the pillars form a plurality of trench capacitors;

forming an insulation layer on the surface of the conductive layer;

forming an insulation layer on exposed side walls of each of the pillars, wherein the exposed side walls are side walls above the surface of the conductive layer;

forming a pair of word lines in each of the row trenches; and forming a plurality of bit lines, each of the bit lines connecting the second pillar portion of each pillar in a column pillars.

* * * * *

UNITED STATES PATENT AND TRADEMARK OFFICE
CERTIFICATE OF CORRECTION

PATENT NO. : 6,764,901 B2
DATED : July 20, 2004
INVENTOR(S) : Noble et al.

It is certified that error appears in the above-identified patent and that said Letters Patent is hereby corrected as shown below:

Title page,
Item [56], References Cited, OTHER PUBLICATIONS,
"Askin, H.O., et al.," reference, after "Parameters" delete "for".
"Foster, R.," reference, delete "et a." and insert -- et al. --, therefor.
"Hodges, W.T., et al.," reference, after "section" insert -- : --.
"Kishimoto, T., et al.," reference, delete "14" and insert -- 34 --, therefor.
"Kohyama, Y., et al.," reference, delete "Honoluly" and insert -- Honolulu --, therefor.
"Kohyama, Y., et al." reference, insert -- ( -- before "Jun.".
"Koshida, N., et al.," reference, delete "Photoluminesceence" and insert
-- Photoluminescence --, therefor.
"Masu, K., et al.," reference, delete "Metallizatin" and insert -- Metallization --,
therefor.
"McCredie, B.D., et al.," reference, delete "462" and insert -- 461 --, therefor.
"Ott, A.W., et al.," reference, delete "A1303" and insert -- AI303 --, therefor.
"Saito, M., et al.," reference, delete "Honoluly" and insert -- Honolulu --, therefor.
"Senthinathan, R., et al.," reference, delete "Parasite" and insert -- Parasitics --, therefor.
"Terauchi, M., et al.," reference, delete "1991" and insert -- 1993 --, therefor.
"Verdonct-Vandebroek, S., et al.," reference, delete "Verdonct" and insert
-- Verdonckt --, therefor.
"Wang, P.W., et al.," reference, delete "Characterization" and insert -- Characteristics --,
therefor.
"Su, D., et al.," reference, delete "Signal– Integrated" and insert -- Signal Integrated --,
therefor.

Column 1,
Line 37, delete "an" and insert -- a --, therefor.

Column 2,
Line 50, after "trench" insert -- . --.

Column 6,
Line 32, after "depicted here." delete "Each memory cell is constructed in a similar manner. Thus, only memory cell 202C is described herein in detail. Memory cell 202C includes pillar 204 of single crystal semiconductor material, e.g., silicon, that is divided into first source/drain region 206, body region 208, and second source/drain region 210 to form access transistor 211. Pillar 204 extends vertically outward from substrate 201 of, for example, p- silicon. First source/drain region 206 and second source/drain region 210 each comprise, for example, n+ silicon and body region 208 comprises P-silicon"

UNITED STATES PATENT AND TRADEMARK OFFICE
CERTIFICATE OF CORRECTION

PATENT NO. : 6,764,901 B2
DATED : July 20, 2004
INVENTOR(S) : Noble et al.

It is certified that error appears in the above-identified patent and that said Letters Patent is hereby corrected as shown below:

Column 6 (cont'd),
and insert -- Each memory cell is constructed in a similar manner. Thus, only memory cell 202C is described herein in detail. Memory cell 202C includes pillar 204 of single crystal semiconductor material, e.g., silicon, that is divided into first source/drain region 206, body region 208, and second source/drain region 210 to form access transistor 211. Pillar 204 extends vertically outward from substrate 201 of, for example, p- silicon. Fast source/drain region 206 and second source/drain region 210 each comprise, for example, n+ silicon and body region 208 comprises P- silicon. -- as a new paragraph on line 33.

Column 7,
Line 1, delete "late" and insert -- plate --, therefor.

Column 8,
Line 49, delete "322" and insert -- 332 --, therefor.

Column 9,
Line 3, delete "322" and insert -- 332 --, therefor.

Column 11,
Line 58, delete "claim 13" and insert -- claim 16 --, therefor.
Line 61, delete "claim 13" and insert -- claim 16 --, therefor.

Column 16,
Lines 52 - 53, after "the top" delete "even with the top".

Column 17,
Line 28, after "substrate," delete "a".

UNITED STATES PATENT AND TRADEMARK OFFICE
CERTIFICATE OF CORRECTION

PATENT NO. : 6,764,901 B2
DATED : July 20, 2004
INVENTOR(S) : Noble et al.

It is certified that error appears in the above-identified patent and that said Letters Patent is hereby corrected as shown below:

Column 18,
Line 3, after "top" delete "even with the top".

Signed and Sealed this

Twenty-second Day of February, 2005

JON W. DUDAS
*Director of the United States Patent and Trademark Office*